(12) United States Patent
Hashimoto

(10) Patent No.: US 6,446,227 B1
(45) Date of Patent: Sep. 3, 2002

(54) SEMICONDUCTOR MEMORY DEVICE

(75) Inventor: Hiroaki Hashimoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/471,285

(22) Filed: Dec. 23, 1999

(30) Foreign Application Priority Data

Jan. 14, 1999 (JP) .......................................... 11-008522

(51) Int. Cl.[7] ............................................. G11C 29/00
(52) U.S. Cl. ..................................... 714/719; 719/721
(58) Field of Search ................................ 365/201, 233; 714/710, 718, 719, 721, 723

(56) References Cited

U.S. PATENT DOCUMENTS

| | | | | |
|---|---|---|---|---|
| 5,587,950 A | * | 12/1996 | Sawada et al. | 365/201 |
| 5,903,514 A | * | 5/1999 | Sawada | 365/233 |
| 5,912,851 A | * | 6/1999 | Matsuoka | 365/201 |
| 5,913,928 A | * | 6/1999 | Morzano | 714/710 |
| 6,032,274 A | * | 2/2000 | Manning | 714/718 |
| 6,058,056 A | * | 5/2000 | Beffa et al. | 365/201 |
| 6,163,863 A | * | 12/2000 | Schicht | 714/718 |

FOREIGN PATENT DOCUMENTS

| | | |
|---|---|---|
| JP | 51-147924 | 12/1976 |
| JP | 61-292300 | 12/1986 |

* cited by examiner

*Primary Examiner*—David Ton
(74) *Attorney, Agent, or Firm*—Young & Thompson

(57) ABSTRACT

The semiconductor memory device of the present invention is characterized in the provision of: data amps provided to each output terminal for amplifying the voltage of data read out from a memory cell, outputting the result as a first output data, and outputting a second output data which is generated from this first output data; a data compressing circuit for compressing the first output data from each the output terminal, and performing testing to determine whether or not this first output data read out from the memory cell is normal based on the compressed results; a plurality of first lines for outputting each the first output data to the data compressing circuit from the data amps; and a second line for connecting and outputting the second output data from the data amps to the data compressing circuit using a wired OR.

9 Claims, 10 Drawing Sheets

SEMICONDUCTOR MEMORY DEVICE

BACKGROUND OF THE INVENTION

1. Technical Field of the Invention

The present invention relates to a semiconductor memory device that is provided with a data compressing circuit that compresses and outputs read data, and shortens the time for testing.

2. Background Art

In order to shorten the testing time when testing semiconductor memory devices, it has been the conventional practice to simultaneously test several devices using an LSI tester. The number of measurement terminals on the LSI tester used in the test is limited, however. Accordingly, the number of semiconductor memory devices that can be simultaneously tested has been restricted based on the number of output terminals possessed by the semiconductor memory device.

For example, in the case of a semiconductor memory device having an 8 bit output terminal number, only 8 devices can be tested simultaneously in an LSI tester capable of simultaneously testing 64 terminals.

Similarly, in the case of a semiconductor memory device having a 16 bit output terminal number, only 4 devices can be tested simultaneously in an LSI tester capable of simultaneously testing 64 terminals.

At present, the bit number for data processing in microcomputers and the like is rising, however, so that an increase in the output terminal number beyond those cited above can be anticipated.

At the same time, advances in process technologies in the field of semiconductor manufacturing have led to an increase in the memory capacity per semiconductor memory device.

In particular, the holding characteristics for the charge held in the memory capacitor must be tested in the dynamic random access memory (DRAM). In this test, data is written into the memory cell, read out several seconds later for example, and a judgment is made as to whether or not the read out information is the same as the write information. Because this test is carried out for each semiconductor memory device, or for each memory cell, it requires several hours.

Thus, when the semiconductor memory device has an output terminal number of 64, the number of semiconductor memory devices which can be tested each time is just one in the case where using a LSI tester capable of simultaneously testing 64 terminals. While increasing the number of measurement terminals which can be tested simultaneously in the LSI tester might be considered, it becomes an extremely expensive capital investment in order to carry out high accuracy testing of properties at high speed.

Moreover, since it is not clear how many output terminals will be in future generations of semiconductor memory devices, it is impossible to determine how far the test bit number needs to be increased.

When testing a semiconductor memory device, a data compressing test mode is employed as a method for performing multiple bit testing simultaneously with a limited output terminal number. Namely, in a semiconductor memory device having a 16 bit output terminal number, 16 bit data is data compressed to 2 bits, and output from two output terminals. As a result, an LSI tester capable of simultaneously testing 64 terminals can test 32 semiconductor memory devices simultaneously without changing the testing time for each unit.

In a semiconductor memory device in which data from one or two input terminals typically determined in advance is input, if there is an input/output terminal number for the data in the semiconductor memory device—for example, 16 input/output terminals for a 16 bit data portion—then the same data is written in the memory cells for each 16 bits. When reading out the data stored in the memory cell, the 16 bit data values are compressed, and the value of the compressed result is used to determine whether or not the data is accurately stored in the memory cell. The above-described testing method is referred to a "parallel testing".

For example, the means for carrying out the aforementioned data compression will be explained using FIGS. 8, 9, and 10. FIGS. 8 and 9 are block diagrams showing the structure of data compressing circuit 100 in a semiconductor memory device having a conventional 16 bit (i.e., data terminal TD0~data terminal TD15) output terminal. FIG. 10 is a schematic diagram showing the structure of a semiconductor memory device (DRAM: dynamic random access memory) in which the data compressing circuit shown in FIGS. 8 and 9 is installed.

In FIG. 10, the memory cell domain is divided into four domains, i.e., memory bank BANK100~memory bank BANK103. Each of the memory banks is formed of four blocks. Memory bank BANK100~memory bank BANK103 are formed in the same manner, and the operation enable state is selected according to an address signal input from an external device.

For this reason, memory bank BANK100 will be explained in detail as a representative example of memory bank BANK100~memory bank BANK103. Structural components in the other memory banks which are identical to the structures in memory bank BANK100 will be assigned the same numeric symbol and an explanation thereof will be omitted.

Memory bank BANK100 is formed of memory block MB100~memory bank MB103. X decoder XDEC100 activates a specific word line based on an address signal input from an external device. Y decoder YDEC100 activates a column switch (Y switch) which connects a specific bit line to a global I/O line based on the address signal input from the external device.

Four global I/O lines GIO100~GIO103 (corresponding to data terminal TD0~data terminal TD3, respectively) are provided to memory block MB100. Data amp DAP100~data amp DAP103 are connected to global I/O line GIO100~global I/O line GIO103, respectively. Data amp DAP100~data amp DAP103 increase the voltage of the data in the bit line selected by the column switch when reading out the data recorded in the memory cell of the semiconductor memory device during data read out.

Similarly, global I/O line GIO104~global I/O line GIO107 (corresponding to data terminal TD4~data terminal TD7), global I/O line GIO108~global I/O line GIO111 (corresponding to data terminal TD8~data terminal TD11), and global I/O line GIO112~global I/O line GIO115 (corresponding to data terminal TD12~data terminal TD15) are provided to memory block MB101~memory block MB103, respectively.

Global I/O line GIO104~global I/O line GIO107, global I/O line GIO108~global I/O line GIO111, and global I/O line GIO112~global I/O line GIO115, are connected to data amp DAP104~data amp DAP107, data amp DAP108~data amp DAP111, and data amp DAP112~data amp DAP115, respectively.

For example, a specific memory cell in the memory block MB100 shown in FIG. 10 is selected by activating the word line corresponding to X decoder XDEC100 and the column switch corresponding to Y decoder 100, and the voltages of the data recorded in each of the memory cells is read out to global I/O line GIO100~global I/O line GIO103.

Data amp DAP100~data amp DAP103 amplify the voltage corresponding to the data read out from each global I/O line GIO100~global I/O line GIO103 (corresponding to data terminal TD0~data terminal TD3). As a result, data amp DAP100 outputs data signal RWBST100 and data signal RWBSN100, which is the inversion of data signal RWBST100, to line LT100 and line LN100, respectively.

Data amp DAP101~data amp DAP103 output data signal RWBST101~data signal RWBST103 and data signal RWBSN101~data signal RWBSN103, obtained by inverting data signal RWBST101~data signal RWBST103, to line LT101~line LT103 and line LN101~line LN103.

A specific memory cell in memory block MB101 is selected by activating the word line corresponding to X decoder XDEC100 and the column switch corresponding to Y decoder 100, and the voltages of the data recorded in each of the memory cells are read out to global I/O line GIO104~global I/O line GIO107, respectively.

Data amp DAP104~data amp DAP107 amplify the voltages corresponding to the data read out from each global I/O line GIO 104~global I/O line GIO107 (corresponding to each data terminal TD4~data terminal TD7, respectively). As a result, data amp DAP104 outputs data signal RWBST104 and data signal RWBSN104, which is the inversion of data signal RWBST104, to line LT104 and line LN104, respectively.

Data amp DAP105~data amp DAP107 output data signal RWBST105~data signal RWBST107 and data signal RWBSN105~data signal RWBSN107, which is the inversion of data signal RWBST105~data signal RWBST107, to each line LT105~line LT107 and line LN105~line LN107, respectively.

A specific memory cell in memory block MB102 is selected by activating the word line corresponding to X decoder XDEC100 and the column switch corresponding to Y decoder 100, and the voltages of the data recorded in each of the memory cells is read out to global I/O line GIO108~global I/O line GIO111, respectively.

Data amp DAP108~data amp DAP111 amplify the voltages corresponding to the data read out from each global I/O line GIO 108~global I/O line GIO111 (corresponding to each data terminal TD8~data terminal TD11). As a result, data amp DAP108 outputs data signal RWBST108 and data signal RWBSN108, which is the inversion of data signal RWBST108, to line LT108 and fine LN108, respectively.

Data amp DAP109~data amp DAP111 output data signal RWBST109~data signal RWBST111 and data signal RWBSN109~data signal RWBSN111, which is the inversion of data signal RWBST109~data signal RWBST111, to each line LT109~line LT111 and line LN109~line LN111, respectively.

A specific memory cell in memory block MB103 is selected by activating the word line corresponding to X decoder XDEC100 and the column switch corresponding to Y decoder 100, and the voltages of the data recorded in each of the memory cells is read out to global I/O line GO112~global I/O line GIO115, respectively.

Data amp DAP112~data amp DAP115 amplify the voltages corresponding to the data read out from each global I/O line GIO112~global I/O line GIO115 (corresponding to each data terminal TD12~data terminal TD15). As a result, data amp DAP112 outputs data signal RWBST112 and data signal RWBSN112, which is the inversion of data signal RWBST112, to line LT112 and line LN112, respectively.

Data amp DAP113~data amp DAP115 output data signal RWBST113~data signal RWBST115 and data signal RWBSN113~RWBSN115, obtained by inverting data signal RWBST113~RWBST115, to each line LT113~line LT115 and line LN113~line LN115, respectively.

As explained above, the data stored in each memory cell in memory bank BANK100 is output to line LT100~line LT115 and line LN100~line LN115 as data signal RWBST100~data signal RWBST115 and data signal RWBSN100~data signal RWBSN115.

In the same manner as memory bank BANK100, memory bank BANK101~memory bank BANK103 designate the data stored in each of the memory cells as data signal RWBST100~data signal RWBST115 and data signal RWBSN100~data signal RWBSN115, which are the inverse of data signal RWBST100~data signal RWBST115, in accordance with the external address, and relay these data to line LT100~line LT115 and line LN100~line LN115.

As a result, the data compressing circuit 100 shown in FIGS. 8 and 9 compresses data signal RWBST100~data signal RWBST115 and data signal RWBSN100~data signal RWBSN115, which are input via line LT100~line LT115 and line LN100~line LN115, respectively, and output from data amp DAP100~data amp DAP115, respectively.

A determination is then made as to whether or not the data in each memory cell of memory bank BANK100~memory bank BANK103 is correctly stored based on the compressed data that is output as a result of the compression operation.

This determination operation for the stored data in the memory cell will now be explained in detail using FIG. 8.

Data compressing circuit 100 shown in FIGS. 8 and 9 compresses to 1 bit the 8 bit data of data signal RWBST100~data signal RWBST107 and data signal RWBSN100~data signal RWBSN107, which were output from each data amp DAP100~data amp DAP107 in memory bank 100~memory bank BANK103. The data which is the 1 bit portion is indicated here using RWBST100 and RWBSN100.

Similarly, data compressing circuit 100 compresses to 1 bit the 8 bit data of data signal RWBST108~data signal RWBST115 and data signal RWBSN108~data signal RWBSN115 which was output from each data amp DAP108~data amp DAP115 in memory bank 100~memory bank BANK103.

For example, control signal RST is input to terminal T101 at [H], latch LTH100 is reset, and the output from output terminal Q of latch LTH100 becomes [L]. Here, at latch LTH100, when [H] is input to control terminal S, then [H] is output to output terminal Q, while when [H] is input to control terminal R, [L] is output to output terminal Q.

Control signal PTEST is input to terminal T100 at [H], and the semiconductor memory device enters the parallel testing state. In this case, [H] data is written in all of the memory cells.

An address signal is input from an external device, and each data signal RWBST100~data signal RWBST115 and data signal RWBSN100~data signal RWBSN115 are output by data amp DAP100~data amp DAP115.

The compression process and the determination of the results are equivalent in the case of data signal RWBST100~data signal RWBST107 and data signal RWBSN100~data signal RWBSN107, and data signal RWBST108~data signal RWBST115 and data signal RWBSN108~data signal RWBSN115. Accordingly, an explanation will be made of data signal RWBST100~data signal RWBST107 and data signal RWBSN100~data signal RWBSN107 compression processing and result determination.

Data stored in the memory cell selected by the address signal is read out. In the result of this read out, all data signal RWBST100~data signal RWBST107 are [H] and all data signal RWBSN100~data signal RWBSN107 are [L].

As a result, the respective outputs of NAND circuit NAND100, NAND circuit NAND103 and NAND circuit NAND106 are [L].

Conversely, the respective outputs of NAND circuit NAND101, NAND circuit NAND104 and NAND circuit NAND107 are [H].

As a result, the output of NAND circuit NAND102, NAND circuit NAND105 and NAND circuit NAND108 becomes [H]. As a result, the output of NAND circuit NAND109 becomes [L]. Accordingly, the result of the determination of the data output from the memory cell is "good quality" without there being a change in the output of LATCH LTH100.

Data stored in the memory cell selected by the address signal is read out, and in the read out result, all data signal RWBST100~107 are [L] and all data signal RWBSN100~107 are [H].

As a result, the respective outputs of NAND circuit NAND100, NAND circuit NAND 103 and NAND circuit NAND106 is [H].

Conversely, the respective outputs of NAND circuit NAND101, NAND circuit NAND104 and NAND circuit NAND107 becomes [L].

As a result, the output of NAND circuit NAND102, NAND circuit NAND105 and NAND circuit NAND108 becomes [H]. As a result, the output of NAND circuit NAND109 becomes [L]. Accordingly, the result of the determination of the data output from the memory cell is "good quality" without there being a change in the output of LATCH LTH100.

Next, the data stored in the memory cell selected by the address signal is read out. In the read out result, all the data signals RWBST100~RWBST106 and data signal RWBST107 are [L], and all the data signals RWBSN100~RWBSN106 and data signal RWBST 107 are [H].

As a result, the respective outputs of NAND circuit NAND100, NAND circuit NAND103, NAND circuit NAND106, and NAND circuit NAND107 become [H].

Further, the respective outputs of NAND circuit NAND101, NAND circuit NAND104 and NAND circuit NAND107 become [L].

As a result, the output of NAND circuit NAND102, NAND circuit NAND105 becomes [H], and the output of the NAND circuit NAND108 becomes [L]. Therefore, the output of NAND circuit NAND109 becomes [H]. Accordingly, the output of latch LTH100 changes from [L] to [H], and the result of the determination of the data output from the memory cells is "poor quality".

Similarly, the data compression of data signal RWBST108~data signal RWBST115 and data signal RWBSN108~data signal RWBSN115 is carried out by NAND circuit NAND111~NAND circuit NAND120. The results of the determination are output from the output terminal Q of latch LTH101.

As a result of the above-described parallel testing, the determination of the quality of the memory cell is made after compressing 8 bits of data to 1 bit. Thus, a quality determination test can be carried out for a semiconductor memory device having a 16 bit output terminal using a 2 bit input terminal. In a LSI tester capable of simultaneously testing 64 bits, it is possible to carry out a determination of the quality of 32 semiconductor memory devices simultaneously.

The voltage of the power source required for operation in the conventional semiconductor memory device is a high 5V. For this reason, when a data signal having a 5V power source voltage amplitude is transmitted across the long distance from the sense amp vicinity to the output terminal vicinity, the signal waveform becomes looser and the delay time in the data signal becomes larger.

Increasing the drive capacity of the data amp may be considered as a strategy for reducing this delay time. However, the chip size of the semiconductor memory device increases as a result, while the electrical current consumed during operation increases. Accordingly, this is not a desirable counterstrategy.

For this reason, in the conventional semiconductor memory device, the amplitude of the output signal is reduced and two signal lines are used for 1 bit. A positive phase data signal is supplied to one signal line, while a complementary data signal is supplied to the other signal line. The output buffer disposed near the vicinity of the output terminal converts the small amplitude signal to a 5V amplitude signal, and outputs it to an external device.

Here, even if the transmission of the data signal is carried out at a small amplitude, a determination of the original data signal can be made by comparing the voltage levels of the positive phase and complementary signal lines. Thus, it becomes possible to output the data signal to the external device as a 5V amplitude signal. In the conventional device, the above-described processing was carried out, so that higher speed and lower power consumption could be anticipated.

However, the above-described semiconductor memory device requires a complementary signal for the 1 bit that is output by the data compressing circuit shown in FIGS. 8 and 9 from the output terminal. Thus, 2 lines are necessary per output terminal.

In other words, the data compressing circuit shown in FIGS. 8 and 9 compresses 16 bits of data to 2 bits. Thus, this semiconductor memory device requires data signal RWBST00~data signal RWBST115 and data signal RWBSN100~data signal RWBSN115.

Thus, it is necessary in the above-described semiconductor memory device to form 32 lines LT100~LT115 and LN100~LN115, in order to output data signal RWBST100~data signal RWBST115 and data signal RWBSN100~data signal RWBSN115 to the data compressing circuit from each data amp DAP100~data amp DAP115 of memory bank BANK100~memory bank BANK103 as shown in FIG. 10.

As a result, the conventional semiconductor memory device having a data compressing circuit requires 32 lines, i.e., two times more lines than the number of output terminals. For this reason, the chip area in the semiconductor memory device increases due to the formation of these lines. Moreover, given that a further increase in the output terminal number may be anticipated, the semiconductor memory device employing a data compressing circuit of the conventional type will require more area for forming these lines.

The conventional data compressing circuit includes logic for performing compression using two signals, including a complementary signal, for one bit of data. Since a large gate number is required, the scale of the circuit becomes larger, and the chip area in the semiconductor memory device increases due to the circuit design. Moreover, since the output terminal number is expected to increase, a semiconductor memory device employing a data compressing circuit of the conventional type will have to increase the number of gates used in the compression logic accompanying the increase in the output terminal number. Thus, extra area for forming the data compressing circuit will be needed.

SUMMARY OF THE INVENTION

The present invention was conceived in view of the above described circumstances, and has as its objective the provision of a semiconductor memory device in which the number of signal lines necessary for the data compressing circuit can be reduced, the area for forming the signal lines can be decreased, the circuit design is simple and the area for forming the data compressing circuit can be reduced, so that the overall chip area is decreased.

In a first aspect, the invention is characterized in that a semiconductor memory device is provided with data amps provided to each output terminal for amplifying the voltage of data read out from a memory cell, outputting the result as a first output data, and outputting a second output data which is generated from this first output data; a data compressing circuit for compressing the first output data from each output terminal, and performing testing to determine whether or not this first output data read out from the memory cell is normal based on the compressed results; a plurality of first lines for outputting each first output data to the data compressing circuit from the data amps; and a second line for connecting and outputting the second output data from the data amps to the data compressing circuit using a wired OR.

In a second aspect, the invention is a semiconductor memory device according to claim 1, characterized in that the data compressing circuit performs a compressing process on a plurality of first output data based on the plurality of first output data and the wired OR output data based on the plurality of the second output data In a third aspect, the invention is characterized in that, in the semiconductor memory device, in which equivalent data is read into all the memory cells in advance when testing, and the data compressing circuit makes a determination of a correct read out when all of the first output data is the same and all of the second output data is the same when read out, and makes a determination of an incorrect read out when one of the first output data differs from the other data or one of the second output data differs from the other data when read out.

In a fourth aspect, the invention is characterized in that the semiconductor memory device is provided with a transistor in which the data amp outputs a second output data using an open drain.

In a fifth aspect, the invention is characterized in that, in the semiconductor memory device, the second line is formed by connecting transistor drains in parallel.

In a sixth aspect, the invention is characterized in that in the semiconductor memory device, precharge transistors are connected to the second line.

In a seventh aspect, the invention is characterized in that, in the semiconductor memory device, a latch circuit is provided to the second line.

In an eighth aspect, the invention is characterized in the provision to a semiconductor memory device of a data amp for each output terminal for amplifying the voltage of the data read out from the memory cell, outputting the result as a first output data, and outputting a second output data generated from the first output data; a data compressing circuit for compressing the first output data of each output terminal, and performing a test to determine whether or not the first output data read out from the memory cell is normal based on the results of this compression; a plurality of first lines for outputting each first output data to the data compressing circuit from this data amp; and a second line for connecting a plurality of OR circuits which perform OR operations between second output data output from the data amp and second data output from other adjacent data amps, performing OR operations between the result of the preceding OR operation and second output data output from other next adjacent data amps, performing OR operations between the second data of all data amps sequentially, and outputting the result of the operation as third output data to the data compressing circuit.

In a ninth aspect, the invention relates to a semiconductor memory device, characterized in that the data compressing circuit performs data compression of a plurality of first output data, based on a plurality of the first output data and the third output data.

DETAILED DESCRIPTION OF PREFERRED EMBODIMENTS

Figure 1:
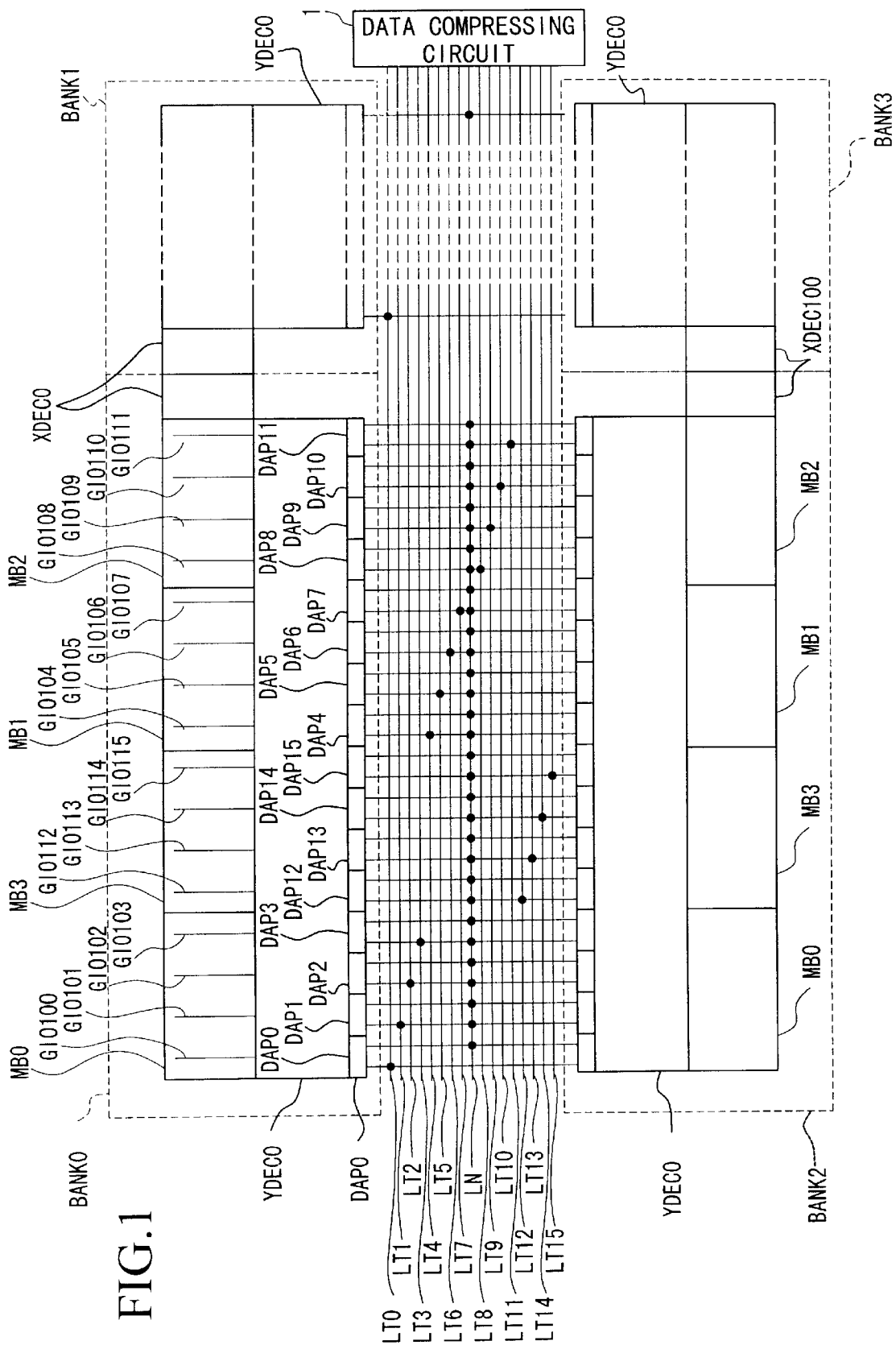
FIG. 1 is a schematic diagram showing the structure of the semiconductor memory device according to an embodiment of the present invention.

Preferred embodiments of the present invention will now be explained with reference to the accompanying figures. FIG. 1 is a block diagram showing the structure of a semiconductor memory device (a synchronous DRAM with 16 bit data output, for example) according to an embodiment of the present invention.

In this figure, the memory cell domain is divided into four domains, i.e., memory bank BANK0~memory bank BANK3, with each of these memory banks being formed of four memory blocks, respectively. Memory bank BANK0~memory bank BANK3 have the same structure here. The enable state for operating a memory bank is optionally selected by means of an address which designates the memory bank in an address signal that is input from an external device.

As the structures are the same, memory bank BANK0 will be explained in detail as a representative example of memory bank BANK0~memory bank BANK3. Structural components in the other memory banks which are identical to the structures in memory bank BANK0 will be assigned the same numeric symbol and an explanation thereof will be omitted. Here, the selection of which one of memory bank BANK0~memory bank BANK3 is employed in the semiconductor memory device is carried out according to the data in the address line that is employed for memory bank selection in the address signal.

M emory bank BANK0 is formed of memory block MB0~memory block MB3. X decoder XDEC0 activates a specific word line based on the address signal input from the external device. Y decoder YDEC0 activates a column switch (Y switch) whichconnects a specific bit line to a global I/O line, based on the address signal that was input from the external device. The data stored in the memory cell is then read out based on the selected word line and the bit line.

Four global I/O line s GIO0~GIO3 (corresponding to the data output terminal TD0~data output terminal TD3 for outputting respective data) are provided to memory block MB0, and are connected respectively to data amp DAP0~data amp DAP3. During data read out, data amp DAP0~data amp DAP3 amplify the voltages of the data on the bit line that was selected by the column switch when the data stored in the memory cell in the semiconductor memory device was read out.

Similarly, memory block MB1~memory block MB3 are respectively provided with global I/O line GIO4~global I/O line GIO7 (corresponding to data output terminal TD4~data output terminal TD7, respectively), global I/O line GIO8~global I/O line GIO11 (corresponding to data output terminal TD8~data output terminal TD11), and global I/O line GIO12~global I/O line GIO15 (corresponding to data output terminal TD12~data output terminal TD15). Data output terminal TD0~data output terminal TD15 are output terminals for outputting data read out from the memory cell, from the semiconductor memory device to an external device.

Global I/O line GIO4~global I/O line GIO7, global I/O line GIO8~global I/O line GIO11, and global I/O line GIO12~global I/O line GIO15, are each connected to data amp DAP4~data amp DAP7, data amp DAP8~data amp DAP11, and data amp DAP12~data amp DAP15, respectively.

For a specific memory cell in the memory block MB0 shown in FIG. 1, for example, a bit line is selected by activating the appropriate word line according to X decoder XDEC0, and the appropriate column switch according to Y decoder 0. Each of the voltages of the data recorded in the aforementioned memory cell are read out to global I/O line GIO0~global I/O line GIO3.

Data amp DAP0~data amp DAP3 amplify the voltages corresponding to the data read out from each global I/O line GIO0~global I/O line GIO3 (corresponding to data terminal TD0~data terminal TD3, respectively). As a result, data amp DAP0 outputs data signal RWBST0 and data signal RWBSN to line LT0 and line LN, respectively, as the data that was stored in the memory cell.

Similarly, data amp DAP1~data amp DAP3 output data signal RWBST1~data signal RWBST3 to line LT1~line LT3, respectively, and data signal RWBSN to line LN, as the data that was stored in each memory cell.

For a specific memory cell in the memory block MB1, a bit line is selected by activating the appropriate word line according to X decoder XDEC0, and the appropriate column switch according to Y decoder 0. Each of the voltages of the data recorded in the aforementioned memory cell are read out to global I/O line GIO4~global I/O line GIO7.

Data amp DAP4~data amp DAP7 amplify the voltages corresponding to the data read out from global I/O line GIO4~global I/O line GIO7 (corresponding to each data terminal TD4~data terminal TD7). As a result, data amp DAP4 outputs data signal RWBST4 and data signal RWBSN to line LT4 and line LN, respectively, as the data that was stored in the memory cell.

Data amp DAP5~data amp DAP7 output data signal RWBST5~data signal RWBST7 to each line LT5~line LT7 and data signal RWBSN to line LN, as the data stored in each memory cell.

For a specific memory cell in the memory block MB2, a bit line is selected by activating the appropriate word line according to X decoder XDEC0, and the appropriate column switch according to Y decoder 0. Each of the voltages of the data recorded in the aforementioned memory cell are read out to global I/O line GIO8~global I/O line GIO11.

Data amp DAP8~data amp DAP11 amplify the voltages corresponding to the data read out from each global I/O line GIO8~global I/O line GIO11 (corresponding to data terminal TD8~data terminal TD11, respectively). As a result, data amp DAP8 outputs data signal RWBST8 and data signal RWBSN to line LT8 and line LN, respectively, as the data stored in the memory cell.

Similarly, data amp DAP9~data amp DAP11 output signal RWBST9~data signal RWBST11 to line LT9~LT11, respectively, and data signal RWBSN to line LN, as the data that was stored in each of the memory cells.

For a specific memory cell in the memory block MB3, a bit line is selected by activating the appropriate word line according to X decoder XDEC0, and the appropriate column switch according to Y decoder 0. Each of the voltages of the data recorded in the aforementioned memory cell are read out to global I/O line GIO12~global I/O line GIO15.

Data amp DAP12~data amp DAP15 amplify the voltages corresponding to the data read out from each global I/O line GIO12~global I/O line GIO15 (corresponding to data terminal TD12~data terminal TD15, respectively). As a result, data amp DAP 12 outputs data signal RWBST12 and data signal RWBSN to line LT12 and line LN, respectively, as the data that was stored in the memory cell.

Similarly, data amp DAP13~data amp DAP15 output data signal RWBST13~data signal RWBST15 to line LT13~line LT15, respectively, and data signal RWBSN to line LN, as the data that was stored in each memory cell.

As explained above, the data stored in the respective memory cells in memory bank BANK0 is output to line LT0~line LT15 as data signal RWBST0~data signal RWBST15, and data signal RWBSN is output to line LN. Here, data output terminal TD0~data output terminal TD15 are the terminals of the semiconductor memory device for carrying out the input of data.

The bonding pad, which is not shown in the figures, corresponding to data output terminal TD0~data output terminal TD15 is disposed in between memory bank BANK0 and memory bank BANK1, memory bank BANK2 and memory bank BANK3, or in the vicinity of the semiconductor memory device chip. The output buffer, which is not shown in the figures, that corresponds to the output terminal is disposed near the bonding pad.

Data signal RWBST0~data signal RWBST15 are input to this output buffer via line LT0~line LT15, respectively. Data signal RWBST0~data signal RWBST15 are subjected to amplifying and other such processing according to each output buffer, and are output to an external device from data output terminal TD0~data output terminal TD15.

In the same manner as memory bank BANK0, memory banks BANK1~memory bank BANK3 output the data stored in each of the memory cells as data signal RWBST0~data signal RWBST15 to line LT0~line LT15, respectively, and data signal RWBSN to line LN, in accordance with the address of the external device.

The numeral 1 indicates a data compressing circuit. Data signal RWBST0~data signal RWBST15 are input via line LT0~line LT15, respectively, and data signal RBSN is input via line LN.

Figure 2:
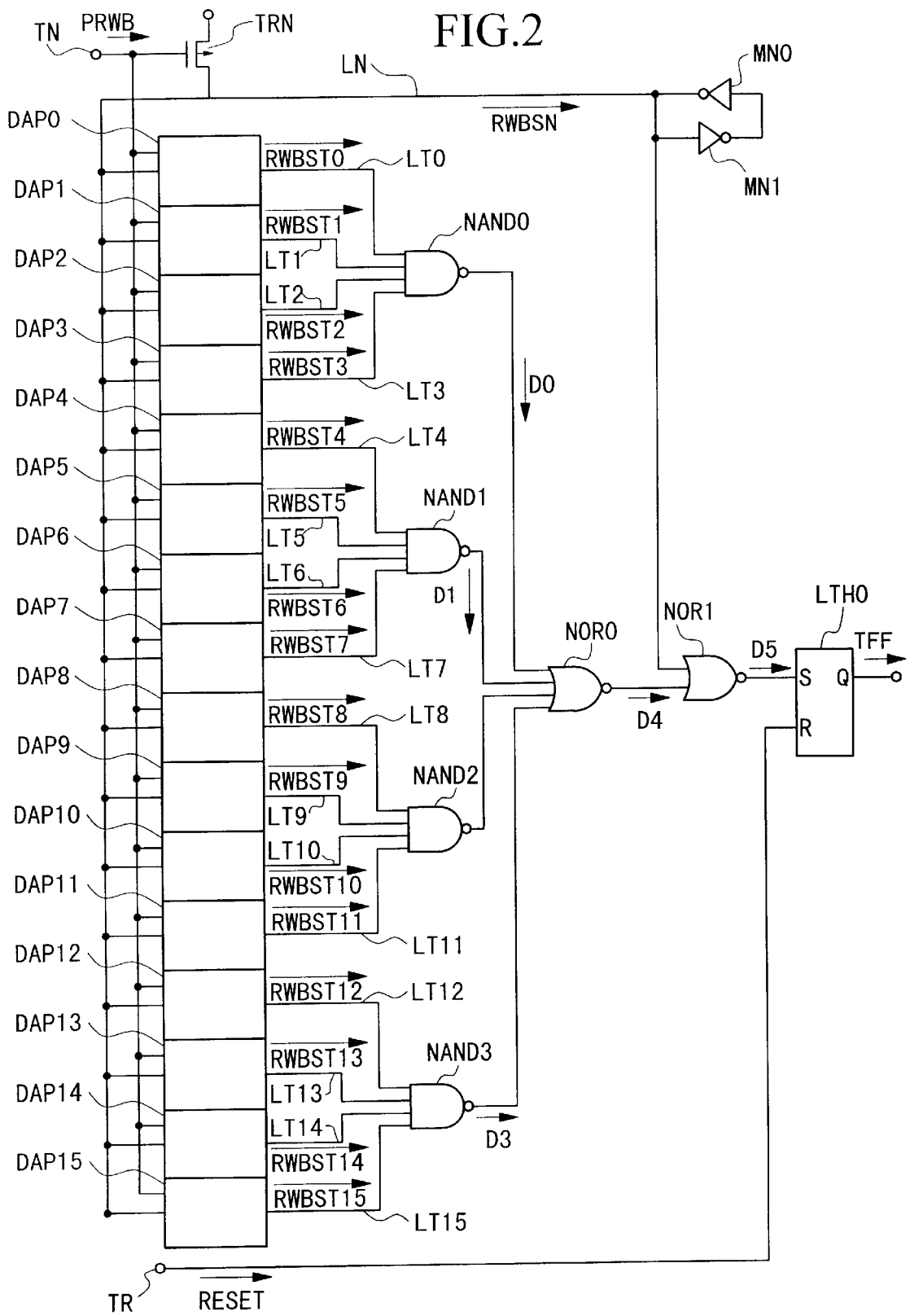
FIG. 2 is a block diagram showing the structure of a data compressing circuit 1 in the semiconductor memory device shown in FIG. 1.

Next, FIG. 2 will be used to explain the data compressing circuit 1 shown in FIG. 1. FIG. 2 is a block diagram showing the structure of data compressing circuit 1. Data amp DAP0~data amp DAP15 (provided to memory bank BANK0 for example) are also included in this figure for the explanation of the device's operation which will be made later.

NAND0~NAND3 are NAND circuits with 4 inputs. NAND0~NAND3 carry out NAND logical operations for the four signals that are input, and output the operation result.

In other words, NAND circuit NAND0 performs a NAND logical operation for data signal RWBST0, data signal RWBST1, data signal RWBST2 and data signal RWBST3, which were input via line LT0~line LT3, respectively, from data amp DAP0~data amp DAP3, and outputs data D0 as the operation result to NOR circuit NOR0.

For example, NAND circuit NAND0 outputs data D0 at [L] level when data signal RWBST0, data signal RWBST1, data signal RWBST2 and data signal RWBST3 are all [H] level. Conversely, NAND circuit NAND0 outputs data D0 at [H] level when even one of data signal RWBST0, data signal RWBST1, data signal RWBST2 and data signal RWBST3 are [L] level.

NAND circuit NAND1 performs a NAND logical operation for data signal RWBST4, data signal RWBST5, data signal RWBST6 and data signal RWBST7, which were input via line LT4~line LT7, respectively, from data amp DAP4~data amp DAP7, and outputs data D1 as the operation result to NOR circuit NOR0.

For example, NAND circuit NAND1 outputs data D0 at [L] level when data signal RWBST4, data signal RWBST5, data signal RWBST6 and data signal RWBST7 are all [H] level. Conversely, NAND circuit NAND1 outputs data D1 at [H] level when even one of data signal RWBST4, data signal RWBST5, data signal RWBST6 and data signal RWBST7 are at [L] level.

NAND circuit NAND2 performs a NAND logical operation for data signal RWBST8, data signal RWBST9, data signal RWBST10 and data signal RWBST11, which were input via line LT8~line LT11, respectively, from data amp DAP8~data amp DAP11, and outputs data D2 as the operation result to NOR circuit NOR0.

For example, NAND circuit NAND2 outputs data D2 at [L] level when data signal RWBST8, data signal RWBST9, data signal RWBST10 and data signal RWBST11 are all [H] level. Conversely, NAND circuit NAND2 outputs data D2 at [H] level when even one of data signal RWBST8, data signal RWBST9, data signal RWBST10 and data signal RWBST11 are at [L] level.

NAND circuit NAND3 performs a NAND logical operation for data signal RWBST12, data signal RWBST13, data signal RWBST14 and data signal RWBST15, which were input via line LT12~line LT15, respectively, from data amp DAP12~data amp DAP15, and outputs data D3 as the operation result to NOR circuit NOR0.

For example, NAND circuit NAND3 outputs data D3 at [L] level when data signal RWBST12, data signal RWBST13, data signal RWBST14 and data signal RWBST15 are all [H] level. Conversely, NAND circuit NAND3 outputs data D3 at [H] level when even one of data signal RWBST12, data signal RWBST13, data signal RWBST14 and data signal RWBST15 are at [L] level.

NOR circuit NOR0 performs NOR logical operations for the four inputs, data D0, data D1, data D2, and data D3, where are output from NAND circuit NAND0~NAND circuit NAND3, and outputs data D4 to NOR circuit 1 as the operation result.

For example, NOR circuit NOR0 outputs [H] level data D5 as the logical operation output when the four inputs, data D0, data D1, data D2 and data D3 are all [L] level. Conversely, NOR circuit NOR0 outputs [L] level data D5 as the logical operation output when one of the four inputs data D0, data D1, data D2 and data D3 is [H] level.

TRN is a p channel transistor provided for precharging line LN to a specific voltage Vs. In p channel transistor TRN, the drain is connected to the power source for voltage Vs and the source is connected to line LN. In addition, in p channel transistor TRN, the gate is connected to terminal TN, and ON/OFF control is exercised by means of a control signal PRWB that is input from a control circuit, not shown, via terminal TN.

In other words, p channel transistor TRN is in the ON state when control signal PRWB is at the [L] level, thereby precharging line LN to a specific voltage Vs value. Further, p channel transistor TRN enters the OFF state when control signal PRWB is at the [H] level, thereby cutting off the connection between line LN and the power source for the specific voltage Vs.

MN0 and MN1 are inverters which, when combined, form a latch. The input terminal of inverter MN0 and the output terminal of inverter MN1 are connected. The output terminal of inverter MN0 and the input terminal of inverter MN1 are connected. In addition, the output terminal of inverter MN0 and the input terminal of inverter MN1 are connected to line LN.

In other words, line LN is precharged to a specific voltage Vs value when p channel transistor TRN is in the ON state, and inverter MN0 and inverter MN1 maintain the voltage Vs value of line LN after p channel transistor TRN enters the OFF state.

TLH0 is a latch which is set according to the data D5 output from NOR circuit NOR, and is reset by a control signal RESET input via terminal TR. In other words, when data D5 is input to terminal S at a [H] level, latch TLHO outputs a [H] level signal TFF data from terminal Q. When control signal RESET is input to terminal R at [H] level, latch TLHO outputs a [L] level signal TFF from terminal Q.

Figure 3:
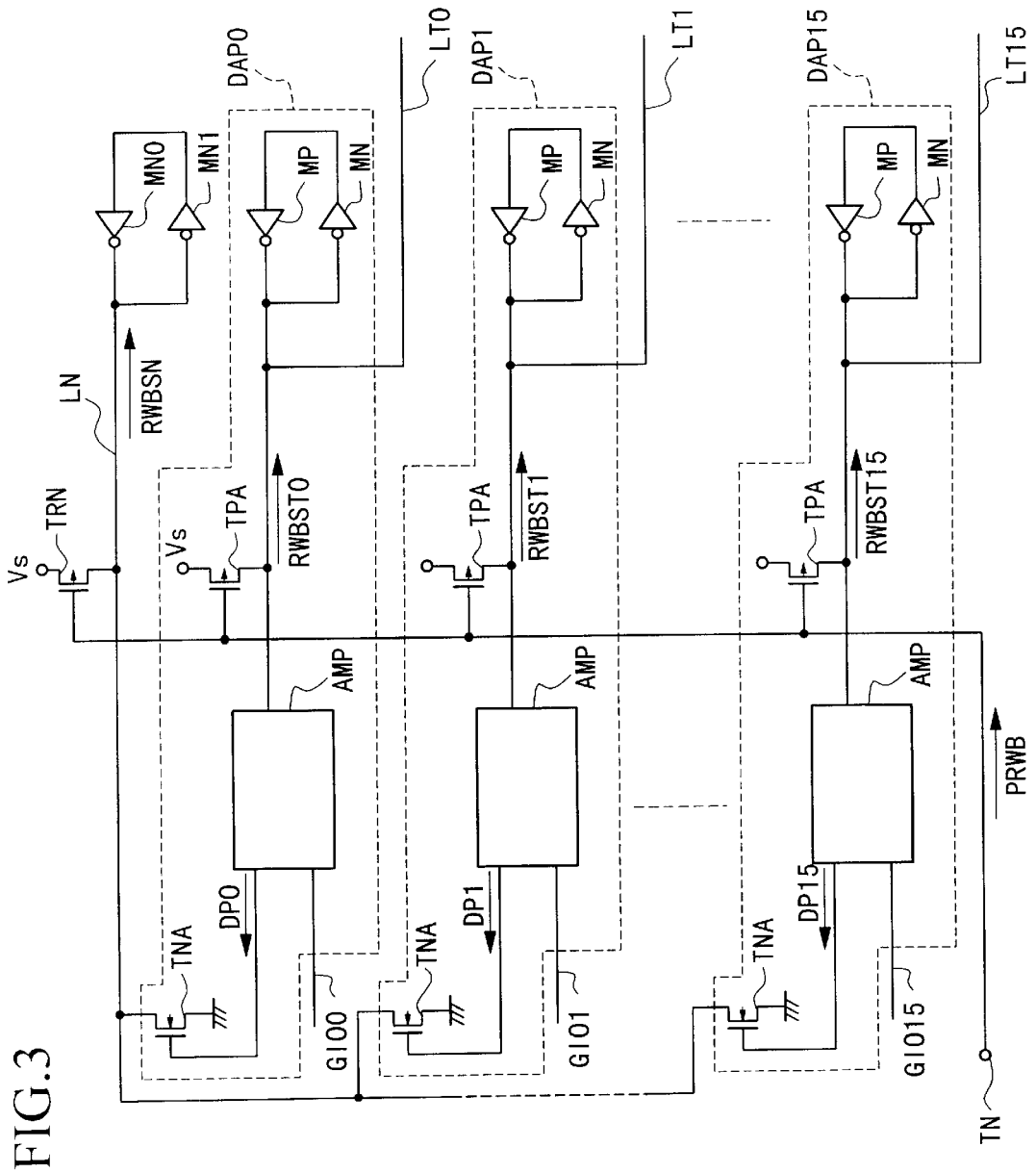
FIG. 3 is a block diagram showing the structure of data amp DAP0~data amp DAP15 shown in FIG. 2.

Next, data amp DAP0~data amp DAP15 employed in FIGS. 1 and 2 will be explained using FIG. 3. FIG. 3 is a block diagram for explaining the structure of data amp DAP0~data amp DAP15 (bank memory BANK0~bank memory BANK3).

In this figure, data amp DAP0 is formed of n channel transistor TNA, p channel transistor TPA, amp circuit AMP, inverter MP and inverter MN. n channel transistor TPA is provided for precharging line LT0 to a specific voltage Vs. In p channel transistor TPA, the source is connected to the power source for voltage Vs and the drain is connected to line LT0. In addition, in p channel transistor TPA, the gate is connected to terminal TN, and ON/OFF control is exercised by means of a control signal PRWB that is input from a control circuit, not shown, via terminal TN.

MN and MP are inverters which, when combined, form a latch. The input terminal of inverter MN and the output terminal of inverter MP are connected, and the output terminal of inverter MN and the input terminal of inverter MP are connected. In addition, the output terminal of inverter MN and the input terminal of inverter MN are connected to line LT0. In other words, line LT0 is precharged to a specific voltage Vs when p channel transistor TPA is in the ON state, and inverter MN and inverter MP maintain the value of the voltage Vs of line LT0 after p channel transistor TPA enters the OFF state.

Amp circuit AMP is formed of a differential amplifier for amplifying the difference between data line GTI/O (True, hereinafter, denoted simply as "T") forming global I/O line GIO0, and base line GTI/O (Negative, hereinafter, denoted simply as "N"). For example, amp AMP outputs an [H] level data signal RWBST0 to line LT0 when [potential of GTI/O (T)>potential of GTI/O(N)]. Conversely, amp AMP outputs an [L] level data signal RWBST0 to line LT0 when [potential of GTI/O(T)<potential of GTI/O(N)].

In other words, amp circuit AMP outputs at [H] level when [potential of GTI/O(T)>potential GTI/O(N)]. Thus, amp circuit AMP maintains the voltage Vs value in line LN after p channel transistor TRN has entered the OFF state, and outputs data signal RWBST0 at [H] level.

In addition, amp circuit AMP outputs at [L] level when [potential of GTI/O(T)<potential GTI/O(N)]. Thus, amp circuit AMP reduces the voltage of line LN, which has been maintained by inverter MN and inverter MP after p channel transistor TRN enters the OFF state, from voltage Vs to the [L] level, and data signal RWBST0 is output at [L] level.

n channel transistor TNA discharges the potential of line LT0 to the [L] level. In other words, when data DP0, which is output by amp circuit AMP and input to the gate, is output at [H] level, the value of the voltage Vs of line LN (i.e., the value of data signal RWBSN) that was maintained by inverter MN and inverter MP after the p channel transistor TRN entered the OFF state is reduced to the [L] level.

The other data amps DAP1~DAP15 are formed in the same way as data amp DAP0. Accordingly, the same numeric symbols will be applied to equivalent structural parts, and a detailed description thereof will be omitted. Here, in the same manner as the operation of data amp DAP0, data amp DAP1~data amp DAP15 input each global I/O line GIO1~global line I/O GIO15, and amplify the difference in the potential of data line GTI/O(T) and the potential of base line GTI/O(N).

Data amp DAP1~data amp DAP15 output the amplified result for the difference between the potential of each data line GTI/O(T) and the potential of base line GTI/O(N) as respective data signals RWBST1~data signal RWBST15 to line LT1~line LT15, respectively.

At the same time, the respective amps of data amp DAP~data amp DAP15 output the amplified result for the difference between the potential of each data line GTI/O(T) and the potential of base line GTI/O(N) as respective data DP1~data DP15. In addition, the ON/OFF control of p channel transistor TNA is performed and the control of the value of data signal RWBSN of line LN is carried out.

Figure 4:
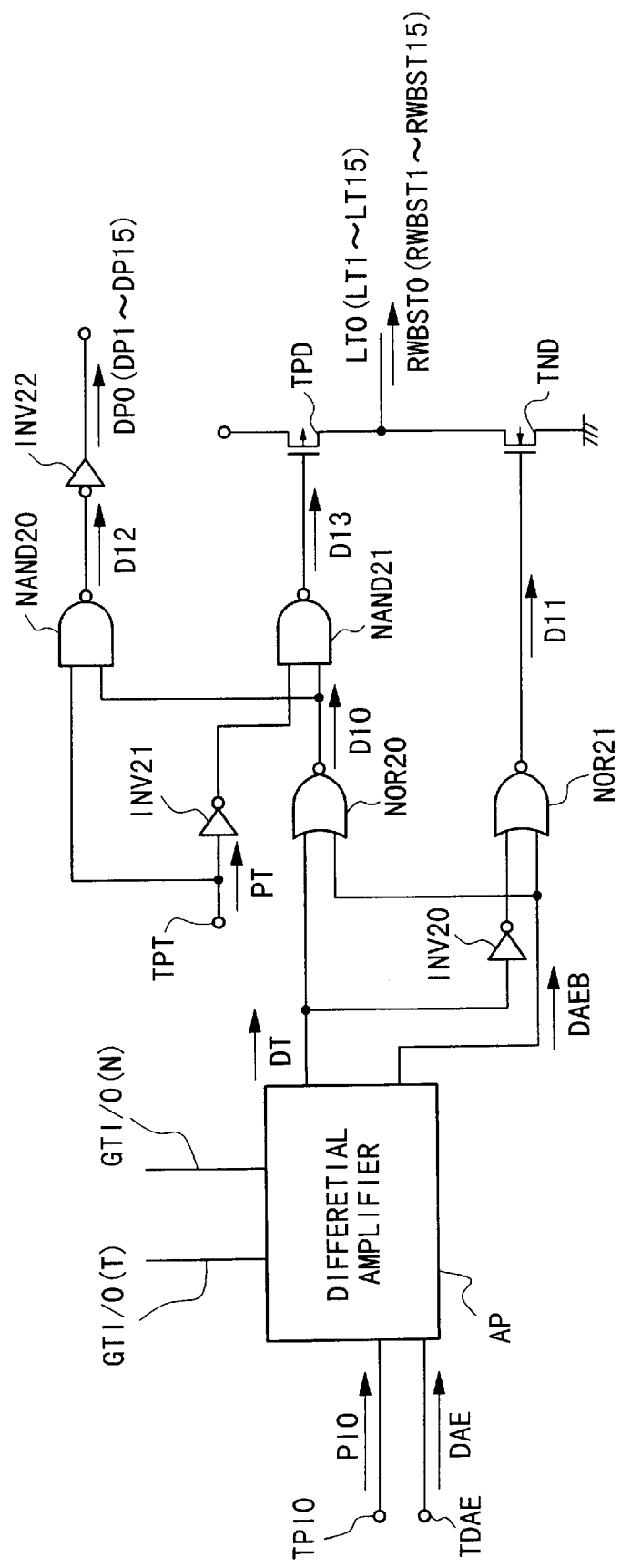
FIG. 4 is a block diagram showing the structure of the amp circuit AMP shown in FIG. 3.

Next, FIG. 4 will be used to explain amp circuit AMP in FIG. 3. FIG. 4 is a block diagram showing the structure of the amp circuit AMP in FIG. 3.

In this figure, AP is a differential amp, for amplifying the difference between the potential of data line GTI/O(T) of the input global I/O line GIO0 (global I/O line GIO1~global I/O line GIO15) and the potential of the base line GTI/O(N), and outputting data DT as the amplified result.

In addition, control signal PIO is input at [H] level, for example, from a control circuit (not shown) via terminal TPIO prior to performing the differential operation, and differential amp AP precharges to a specific value the potential of data line GTI/O(T) and the potential of base line GTI/O(N).

Control signal DAE is input at [H] level, for example, from a control circuit (not shown) via terminal TDAE, the column switch is activated, and differential amp AP is activated while at the same time the potential of data line GTI/O(T) begins transitioning to a potential corresponding to the data which is stored in the memory cell. At this time, differential amp AP outputs signal DAEB, which is the inverse of the input control signal DAE.

NOR20 is a NOR circuit for performing NOR logical operations on the value of the input data DT and signal DAEB, and outputting the result as data 10. In other words, NOR circuit NOR20 outputs data D10 as the operation result at [H] level when both the input data DT and signal DAEB are [L] level. On the other hand, NOR circuit NOR20 outputs data D10 as the operation result at [L] level when either the input data DT or signal DAEB are [H] level.

INV20 is an inverter for inverting the value of data DT and outputting the inverted result to NOR circuit NOR21.

NOR circuit NOR21 carries out the NOR logical operation for the value of signal DAEB and the value input from inverter INV20, and outputs the result as data 11 to the gate of n channel transistor TND.

In other words, NOR circuit NOR21 outputs data D11 as the operation result using [H] level when both the value input from inverter INV20 and the signal DAEB are [L] level. Conversely, NOR circuit NOR21 outputs data D11 as the operation result using [L] level when either the value input from inverter INV20 or the signal DAEB are [H] level.

NAND20 is a NAND circuit for carrying out NAND logical operations for the value of data D10 and control signal PT input from a control circuit, not shown, via terminal TPT, and outputting the operation result as data D12 to INV22.

In other words, NAND circuit NAND20 outputs data D12 as the operation result using [L] level when the value of data D10 and the control signal PT input via terminal TPT from a control circuit, not shown, are both [H] level. Conversely, NAND circuit NAND20 outputs data D12 as the operation result using [H] level when the value of either data D10 and the control signal PT input via terminal TPT from a control circuit, not shown, are both [L] level.

INV22 is an inverter for inverting the value of data D12 input from NAND circuit NAND20, and outputting the inverted result to the gate of n channel transistor TNA (FIG. 3) as signal DP0 (signal DP1~signal DP15).

INV21 is an inverter for inverting the value of control signal PT input from a control circuit (not shown) via terminal TPT, and outputting the inverted result to NOR circuit NOR21 as signal PDB.

NAND21 carries out NAND logical operations for the value of data D10 and the value input from inverter INV21, and outputs data D13 as the operation result to the gate of p channel transistor TPD.

In other words, NAND circuit NAND21 outputs data 12 as the operation result at [L] level when both the value input from inverter INV21 and the value of data D10 are [H] level. Conversely, NAND circuit NAND21 outputs data D12 as the operation result using [H] level when either the value input from inverter INV21 or the value of data D10 is [L] level.

Here, control signal PT controls whether or not to carry out parallel testing (i.e., testing in which compressing of a plurality of parallel data is carried out). For example, when control signal PT is at [H] level, the system enters the test mode for performing parallel testing. NAND circuit NAND20 enables the operation to output data D12 based on data DT. Conversely, when control signal PT is at [L] level, the system enters a mode in which parallel testing is not performed. The output of data D12 by NAND circuit NAND20 is fixed at [H] level, and the input of data DT is masked.

At NAND circuit NAND21, when control signal PT is at [H] level, for example, the system enters the test mode for carrying out parallel testing. At NAND circuit NAND21, the input of data DT is masked, and the data D12 output is fixed at [H] level. As a result, operation based on data DT is not possible. Conversely, when control signal PT is at [L] level, the system enters the mode in which parallel testing is not carried out. The output of NAND circuit NAND21 can be enabled to vary data D13 that is output based on data DT.

At p channel transistor TPD, the source is connected to power source Vs, and the drain is connected to line LT0 (line LT1~line LT15). p channel transistor TPD enters the ON state when data D13 which is input to the gate becomes [L] level, and enters the OFF state when data D13 which is input to the gate becomes [H] level.

At n channel transistor TND, the drain is connected to line LT0 (line LT1~line LT15), and the source is grounded. n channel transistor TND enters the ON state when data D11 which is input to the gate becomes [H] level, and enters the OFF state when data D11 which is input to the gate becomes [L] level.

For example, when p channel transistor TPD is in the ON state and n channel transistor TND is in the OFF state, data signal RWBST0 (date signal RWBST1~data signal RWBST15) becomes [H] level. On the other hand, when p channel transistor TPD is in the OFF state and n channel transistor TND is in the ON state, data signal RWBST0 (date signal RWBST1~data signal RWBST15) becomes [L] level.

Next, an example of the operation of an embodiment will be explained with reference to FIGS. 1, 2, 3, 5 and 6.

Figure 5:
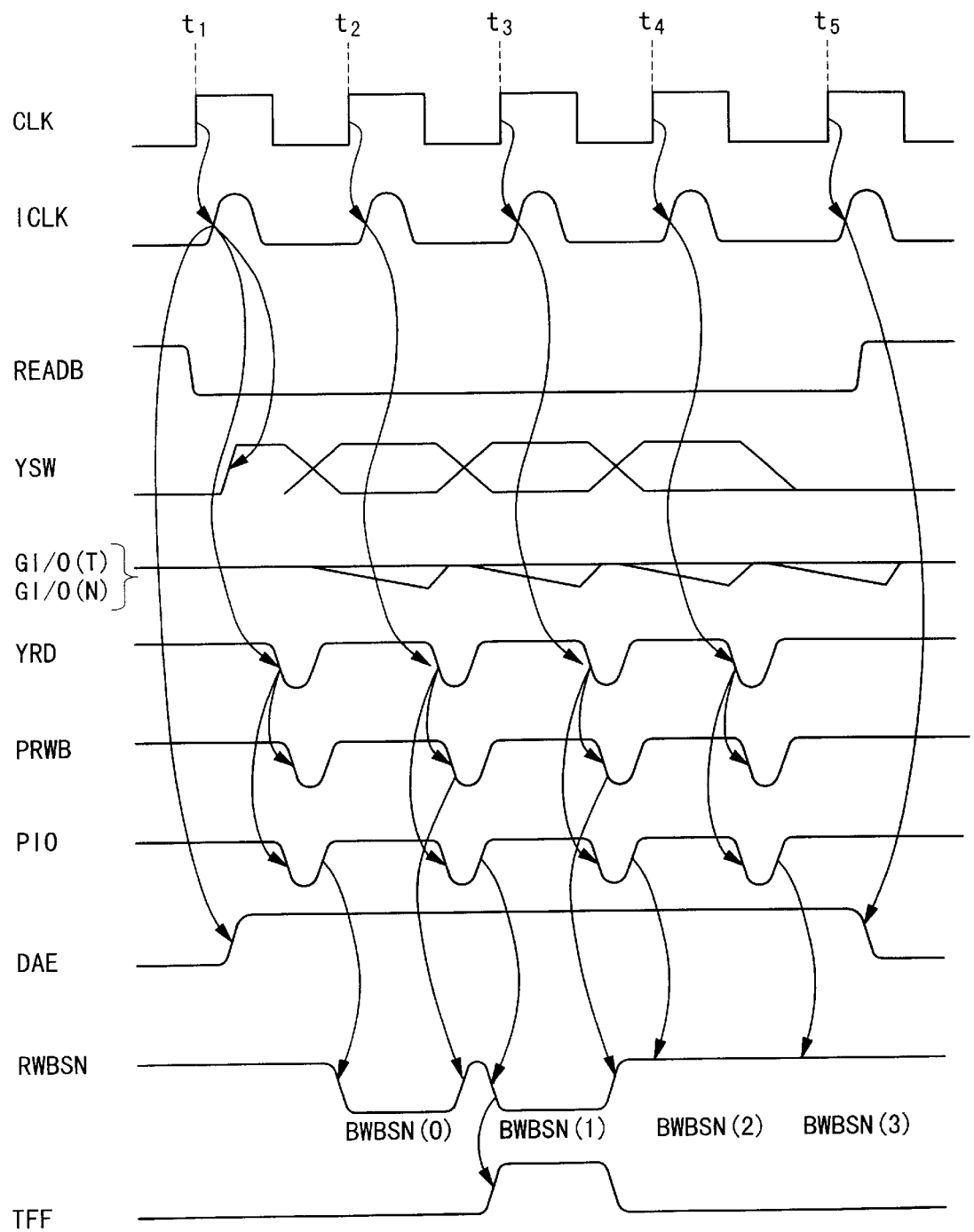
FIG. 5 is a timing chart showing the operation of the semiconductor memory device according to an embodiment of the present invention.

FIG. 5 is a timing chart showing the operation in the parallel testing mode in the embodiment.

Figure 6:
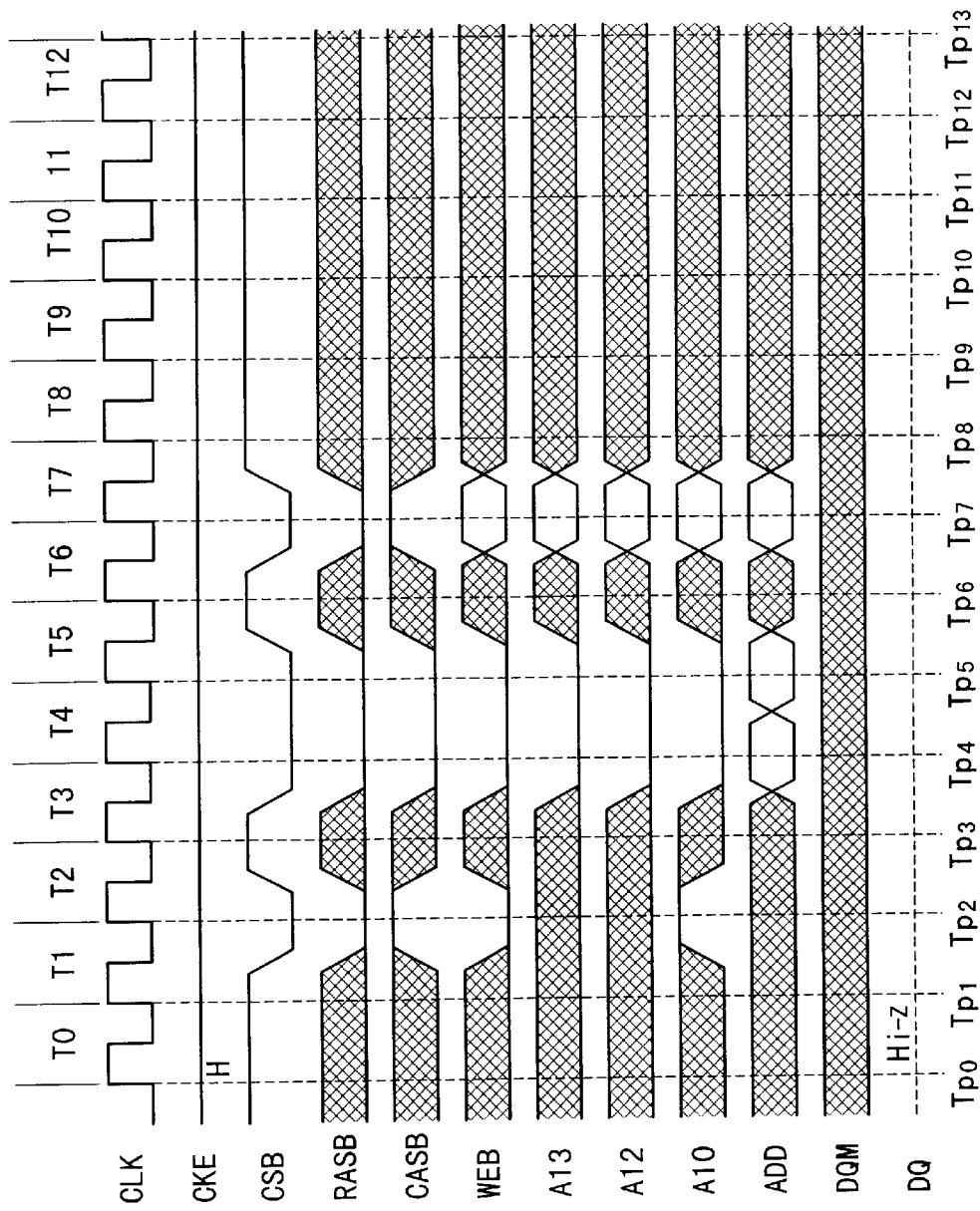
FIG. 6 is a timing chart showing the operation of the semiconductor memory device according to an embodiment of the present invention.

First, a command to place the semiconductor memory device in a parallel testing mode is input, in accordance with the timing chart for the command input for parallel testing that is shown in FIG. 6.

In this figure, signal CLK is a cyclical base signal (clock) input from an external device, and is employed to synchronize internal operation. Signal CKE controls whether or not signal CLK is input. At this time, signal CKE is at [H] level from clock time tp1 to clock time tp14, and the input of signal CLK to the internal circuits of the semiconductor memory device is enabled.

Time T0 to time T12 shows each of the cycles from clock time tp1 to clock time tp13, with all of the time intervals having an equal value. Signal CSB is a chip enable signal. At [H] level, the semiconductor memory device is in the non-selecting state, and operation is not possible, while at [L] level, the semiconductor memory device is in the selecting state and operation is enabled.

Signal RASB is a control signal for inputting a low address. At [L] level, the input signal ADD is input as a low address for controlling XDEC0. Signal CASB is a control signal for inputting a column address. When signal CASB is at [L] level, input signal ADD is input as a column address for controlling YDEC0. Signal WEB carries out control of writing of data to the semiconductor memory device. Here, when signal WEB is at [L] level, writing of the data to the semiconductor memory device is permitted.

Signal A12 and signal A13 are employed in the selection of which memory bank to use from among memory bank BANK0~memory bank BANK3. For example, when signal A12 and signal 13 are both [L] level, memory bank BANK0 is used. When signal A13 is [H] level with signal A12 at [L] level, memory bank BANK2 is selected.

Signal A10 is employed in the selection of the precharge mode. For example, when signal A10 is at [H] level during input of the precharge command, all of memory bank BANK0~memory bank BANK3 are precharged. In addition, when signal A10 is at [L] level when inputting the precharge command, the memory banks selected by signal A12 and signal A13 are precharged. Signal DQM masks the data output, and data output DQ is set to [L] level irrespective of the value of the data.

At time tp2, a command is provided to carry out precharging of all memory banks BANK0~BANK3.

Next, at time tp4, a signal ADD is set in the specific data, signals RASB and CASB are set to [L] level, and a mode register light command (processing for initial settings) is provided.

Next, at time tp5, specific data for signal ADD is written in the mode register. As a result, entry into the parallel testing mode for the semiconductor memory device is carried out. At this time, output DQ (the output data from data terminal TD0~data terminal TD15) all enter the high impedance state.

Next, an example of the operation of parallel testing in the semiconductor memory device which has been set in the parallel testing mode will be explained by referring back to FIG. 5.

Each of the signals that will be used will be explained. Signal CLK is a signal equivalent to signal CLK input from the external device that was explained in FIG. 6. At this time, the read command is input. The column latency is set at [CLT=1], and the burst length is set at [BL=4].

Signal ICLK is an internal clock signal that is generated in synchronization with the rise in the signal CLK and is used inside the semiconductor memory device. It is the basic signal for all operations.

Signal READB is an internal signal set as the burst length which is designated when the system enters the read mode. Signal READB is the period in which four data are output and is at [L] level.

Signal YSW controls the ON/OFF of the column switch. Signal YSW places the column switch in the ON state at [H] level, and places the column switch in the OFF state at [L]

level. Data line GTI/O(T) and base line GTI/O(N) express the values of the data stored in the memory cell via global I/O line GIO0 (global I/O line GIO1~global I/O line GIO15).

Signal YRD is an intermediate signal generated in synchronization with the rise in signal ICLK, for forming each of the subsequent signals.

Signal PRDB is formed in synchronization with the fall in signal YRD, and is a control signal for setting p channel transistor TRN to the ON state in order to precharge line LN to a specific voltage Vs.

Signal PIO is formed in synchronization with the fall in signal YRD, and is a control signal for setting p channel transistor TPA to the ON state in order to precharge line LT0 (line LT1~line LT15) to a specific voltage Vs.

Signal DAE is formed in synchronization with the rise in signal YRD and, for example, activates data amp circuit AMP at [H] level.

Since [BL=4] is defined in FIG. 5, data which is burst output to line LN is designated as data signal RWBSN(0)~data signal RWBSN(3) based on the output of data amp DAP0~data amp DAP15. In addition, address signal ARDS is input, the low address in input, XdecoderXDEC0 is activated, and the word line is selected in advance. At this time, global I/O line GIO0~global I/O line GIO15 and line LN, and line LT0~line LT15 are precharged.

At clock time t1, signal ICLK is generated in synchronization with the rise in signal CLK. When signal READB is [L] during the rise in signal ICLK, a read command is input to the semiconductor memory device so that the system enters the read out state. Signal YRD is then generated in synchronization with the rise in signal ICLK. In addition, signal DAE becomes [H] level in synchronization with the signal ICLK rise. Next, signal PRWB and signal PIO are generated in synchronization with the fall in signal YRD. At line LN and line LT0~line LT15, p channel transistor TRN and p channel transistor TPA are placed in the ON state by signal PRWB, and are each recharged to a specific voltage Vs.

Global I/O line GIO0~global I/O line GIO15 are precharged to a specific voltage by signal PIO. When the column switch designated by the address signal enters the ON state (YSW signal is [H] level), then, with signal PIO in the [H] level state, data amp DAP0~data amp DAP15 are activated (data line GTIO(T) and data line GTIO(N) are each connected to data amp DAP0~data amp DAP15, respectively). In addition, latch LTH0 is reset by control signal RESET and output TFF is placed at [L] level.

At this time, when the data written in advance in the memory cell designated by the address signal is at [L] level, if the read out from the designated memory cell is correct, then data DP of each differential amp AMP of data amp DAP0~data amp DAP15 is output at [L] level, and the data DP0~data DP15 output from data amp DAP0~data amp data DAP15 are all at [H] level. For this reason, the n channel transistor TNA is placed in the ON state, and signal RWBSN (0) is output at [L] level in order to remove the charge on line LN.

When the data written in advance in the memory cell designated by the address signal is at [L] level, if the read out from the designated memory cell is correct, then data signal RWBST0~data signal RWBST15 output via lines LT0~line LT15, respectively, from data amp DAP0~data amp DAP15 all become [H] level, and the output of data D4 becomes [H] level.

Accordingly, since data signal RWBSN(0) (data signal RWBSN) is at [L] level, and the output of data D4 is [H]

level, data D5 remains at [L] level and signal TFF output from latch LTH0 remains at [L] level. No anomaly is present in the 16 bit memory cell designated by the address signal at this time, and a determination of [PASS (no problems)] is made. As described above, in the case of [PASS (no problem)], data signal RWBSN and data signal RWBST0~data signal RWBST15 on line LT0~line LT15 which are output to the output buffer corresponding to the output terminal, actually have opposite characteristics.

Next, at clock time t2, signal ICLK is generated in synchronization with the rise in signal CLK. Signal YRD is generated in synchronization with the rise in this signal ICLK. Next, signal PRWB and signal PIO are generated in synchronization with the fall in signal YRD. At line LN, and line LT0~line LT15, p channel transistor TRN and p channel transistor TPA enter the ON state in accordance with signal PRWB, and line LN and line LT0~line LT15 are precharged to a specific voltage Vs.

Global I/O line GIO0~global I/O line GIO15 are precharged to a specific voltage by signal PIO. The column switch designated by the address signal enters an ON state, and, simultaneously, with signal PIO at [H] level, data amp DAP0~data amp DAP15 are activated. Latch LTH0 is reset by control signal RESET and the output TFF becomes [L] level.

At this time, when, for example, the data written in advance in the memory cell designated by the address signal is at [L] level, and a given memory cell is no good, the data DP of a differential amp AMP of one of data amp DAP0~data amp data DAP15 is output at [H] level, and one of the data DP0~data DP15 output from data amp DAP0~data amp DAP15 is at [L] level. Even so, because most of data DP0~data DP15 are at [H] level, n channel transistor TNA is placed in the ON state, and data signal RWBSN(1) is output at [L] level in order to remove the charge on line LN.

When the data written in advance to the memory cell designated by the address signal is at [L] level, and the memory cell is no good as described above, then one of data signal RWBST0~data signal RWBST15, which are output from data amp DAP0~data amp DAP15 via line LT0~line LT15, respectively, is at [L] level, so that the output of data D4 becomes [L] level.

Accordingly, data signal RWBSN(1) (data signal RWBSN) is [L] level, and the output of data D4 is [L] level. For this reason, data D5 transitions to [H] level, and signal TFF which is output by latch LTH0 is [H] level. An anomaly is present in one of the memory cells of the 16 bits designated by the address signal at this time, so that a determination of [FAIL (problem present)] is made.

In addition, at time t2, signal ICLK is generated in synchronization with the rise in signal CLK. Signal YRD is generated in synchronization with the rise in this signal ICLK. Next, signal PRWB and signal PIO are generated in synchronization with the fall in signal YRD. At line LN, and line LT0~line LT15, p channel transistor TRN and p channel transistor TPA enter the ON state in accordance with signal PRWB, and line LN and line LT0~line LT15 are precharged to a specific voltage Vs respectively.

Global I/O line GIO0~global I/O line GIO15 are precharged to a specific voltage by signal PIO. The column switch designated by the address signal enters an ON state, and, simultaneously, with the signal PIO at [H] level, data amp DAP0~data amp DAP15 are activated. Latch LTH0 is reset by control signal RESET and the output TFF becomes [L] level.

In a situation opposite that described above, when, at this time, for example, the data written in advance in the memory cell designated by the address signal is at [H] level, and a given memory cell is no good, the data DP of a differential amp AMP of one of data amp DAP0~data amp DAP15 is output at [L] level, and one of the data DP0~data DP15 output from data amp DAP0~data amp DAP15 is at [H] level. In this case, even if most of data DP0~data DP15 are at [L] level, the n channel transistor TNA of one of the data amps is placed in the ON state, and data signal RWBSN(1) is output at [L] level in order to remove the charge on line LN.

When the data written in advance to the memory cell designated by the address signal is at [H] level, and the memory cell is no good as described above, then one of data signal RWBST0~data signal RWBST15, which are output from data amp DAP0~data amp DAP15 via line LT0~line LT15, respectively, is at [L] level, and the other lines are at [H] level. Thus, the output of data [D4] becomes [L] level.

Accordingly, data signal RWBSN(1) (data signal RWBSN) is [L] level, and the output of data D4 is [L] level. For this reason, data D5 transitions to [H] level, and signal TFF which is output by latch LTH0 becomes [H] level. An anomaly is present in one of the memory cells of the 16 bits designated by the address signal at this time, so that a determination of [FAIL (problem present)] is made.

Next, at time t3, signal ICLK is generated in synchronization with the rise in signal CLK. Signal YRD is generated in synchronization with the rise in this signal ICLK. Next, signal PRWB and signal PIO are generated in synchronization with the fall in signal YRD. At line LN, and line LT0~line LT15, p channel transistor TRN and p channel transistor TPA enter the ON state in accordance with signal PRWB, and line LN and line LT0~line LT15 are precharged to a specific voltage Vs respectively.

Global I/O line GIO0~global I/O line GIO15 are precharged to a specific voltage by signal PIO. The column switch designated by the address signal enters the ON state, and, simultaneously, with the signal PIO at [H] level, data amp DAP0~data amp DAP15 are activated. Latch LTH0 is reset by control signal RESET and the output TFF becomes [L] level.

At this time, when, the data written in advance in the memory cell designated by the address signal is at [H] level, if the readout from the designated memory cell is normal, then data DP from each of the differential amps AMP of data amp DAP0~data amp DAP15 is output at [H] level, and all data DP0~DP15 output from data amp DAP0~data amp DAP15 are at [L] level. For this reason, the n channel transistors TNA of all data amps are placed in the OFF state, and data signal RWBSN(2) is output at [H] level since the charge on line LN is not removed.

When the data written in advance in the memory cell designated by the address signal is at [H] level, if the read out from the designated memory cell is correct, then data signal RWBST0~data signal RWBST15 output via lines LT0~line LT15, respectively, from data amp DAP0~data amp DAP15 all become [L] level, and the output of data D4 becomes [H] level.

Accordingly, since data signal RWBSN(2) (data signal RWBSN) is at [L] level, and the output of data D4 is [H] level, data D5 remains at [L] level without changing, and signal TFF output from latch LTH0 remains at [L] level. No anomaly is present in any of the read out results of data from the 16 bit memory cell designated by the address signal at this time, and a determination of [PASS (no problems)] is made.

Next, at clock time t4, signal ICLK is generated in synchronization with the rise in signal CLK. Signal YRD is generated in synchronization with the rise in this signal ICLK. Next, signal PRWB and signal PIO are generated in synchronization with the fall in signal YRD. At line LN, and line LT0~line LT15, p channel transistor TRN and p channel transistor TPA enter the ON state in accordance with signal PRWB, and line LN and line LT0~line LT15 are precharged to a specific voltage Vs.

Global I/O line GIO0~global I/O line GIO15 are precharged to a specific voltage by signal PIO. The column switch designated by the address signal enters an ON state, and, simultaneously, with signal PIO at [H] level, data amp DAP0~data amp DAP15 are activated. Latch LTH0 is reset by control signal RESET and the output TFF becomes [L] level.

When the data written in advance in the memory cell designated by the address signal is at [H] level, if the read out is correct, then data DP from respective differential amps AMP of data amp DAP0~data amp DAP15 are all output at [H] level, and all of data DP0~data DP15 output from data amp DAP0~data amp data DAP15 become [L] level. For this reason, the n channel transistors TNA of all of the data amps are placed in the OFF state, and data signal RWBSN (3) is at [H] level since the charge on line LN is not removed.

All of data signal RWBST0~data signal RWBST15 output from data amp DAP0~data amp DAP15 via line LT0~line LT15 are [L] level, and the output of data D4 is at [L] level.

Accordingly, since data signal RWBSN(3) (data signal RWBSN) is at [H] level, and the output of data D4 is [L] level, data D5 remains at [L] level. No anomaly is present in the 16 bit memory cell designated by the address signal at this time, and a determination of [PASS (no problems)] is made.

Next, at clock time t5, signal ICLK is generated in synchronization with the rise in signal CLK. Signal READB, synchronized with the rise in this signal ICLK, becomes [L] level. At the same time, signal DAE becomes [L] level, and the read out state is concluded.

In the parallel testing mode, signal TFF for the result of the above-described determination is output to the output buffer of a specific output terminal (not shown) from among the 16 output terminals, which output the data from the semiconductor memory device and output 16 bit data in parallel, and is then output to an external device (not shown) from the output terminal via this output buffer. As a result, the determined result for the 16 bit data read out in parallel from the 16 memory cells is output to an external device as 1 bit data from one of the data output terminals of data output terminal TD0~data output terminal TD15.

The bonding pad, not shown in the figures, corresponding to data output terminal TD0~data output terminal TD15 is disposed in between memory bank BANK0 and memory bank BANK1, memory bank BANK2 and memory bank BANK3, or in the vicinity of the semiconductor memory device chip. The output buffer, which is not shown in the figures, that corresponds to the output terminal is disposed near the bonding pad.

As a result, the determination for the data read out from the memory cell of a semiconductor memory device having 16 data output terminals TD0~TD15 which output 16 bit data in parallel can be compressed according to a one bit signal TFF output by one specific data output terminal, for example, data terminal TD0. In other words, in an LSI tester capable of simultaneously testing 64 bits, it is possible to simultaneously test 64 semiconductor memory devices having 16 data output terminals TD0~TD15 in which 16 bit data is output in parallel.

As discussed above, in data compressing circuit 1 of the semiconductor memory device according to the embodiment, the data signal line which is input for use in data compression becomes 16 bit (data signal)+1 bit (wired OR for all data signals). Here, based on data DP0~data DP15, the wired OR (data signal RWBSN of line LN) portion of n channel transistor TPA has half the compression/determination function of conventional data compressing circuits.

For this reason, the area in which the lines are formed from data amp DAP0~data amp DAP15 to data compressing circuit 1 in this semiconductor memory device is significantly reduced as compared to the area for forming 32 lines when using the conventional 16 bit (data signal)+16 bit (inverted signal of the data signal).

Further, in the semiconductor memory device according to the embodiment, the data signals employed in data compression are reduced, while at the same time, the wired OR portion has half of the compression/determination function for the data compressing circuit. Thus, the number of logical gates at which data compressing circuit 1 also carries out compression is greatly reduced as compared to the conventional data compressing circuit. As a result, it becomes possible to decrease the area for forming the circuit.

The semiconductor memory device of the preceding embodiment was described using the example of a semiconductor memory device having a 16 bit output. However, implementation in a semiconductor memory device having an output of 8 bits, 32 bits, 64 bits or another bit number is also possible.

In addition, in the semiconductor memory device of the aforementioned embodiment, 16 bits were compressed to 1 bit. However, a design in which 16 bits are compressed to 8 bits each, and then to 2 bits is also possible. In this case, the number of lines becomes 18 bits, i.e., (8 bits+1 bit)+(8 bits+1 bit). In this way, a structure is also possible in which multiple bit outputs are separated into a plurality of compression groups, and each compressed.

In the preceding, an embodiment of the present invention was explained in detail with reference to the accompanying figures. However, the specific structure of the present invention is not limited to this embodiment. Rather, design modifications are included within the scope of the present invention, provided there is no deviation from the essence of the invention.

Figure 7:
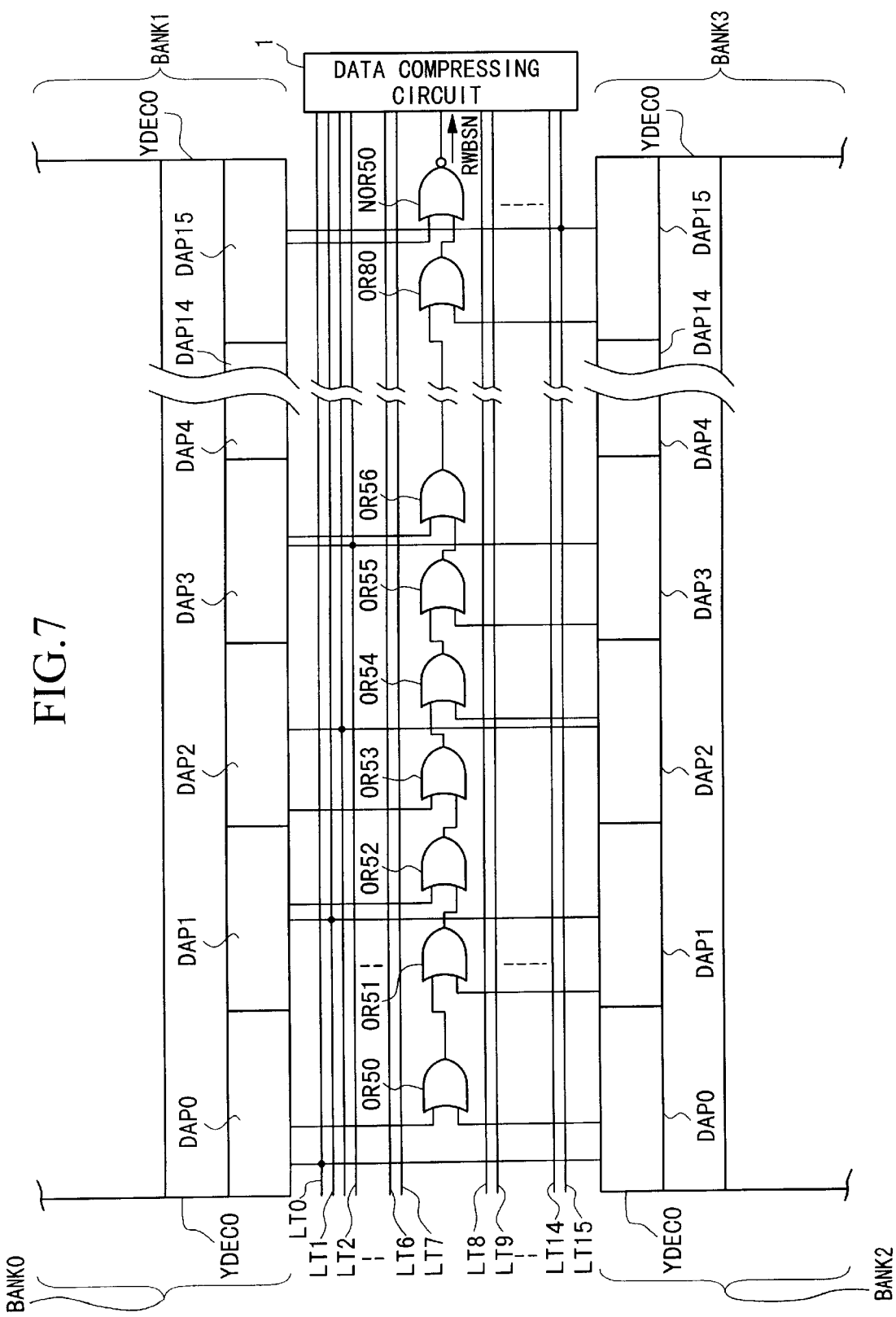
FIG. 7 is schematic diagram showing the structure of the line from the data amp to the data compressing circuit of the semiconductor memory device according to the second embodiment of the present invention.
Figure 8:
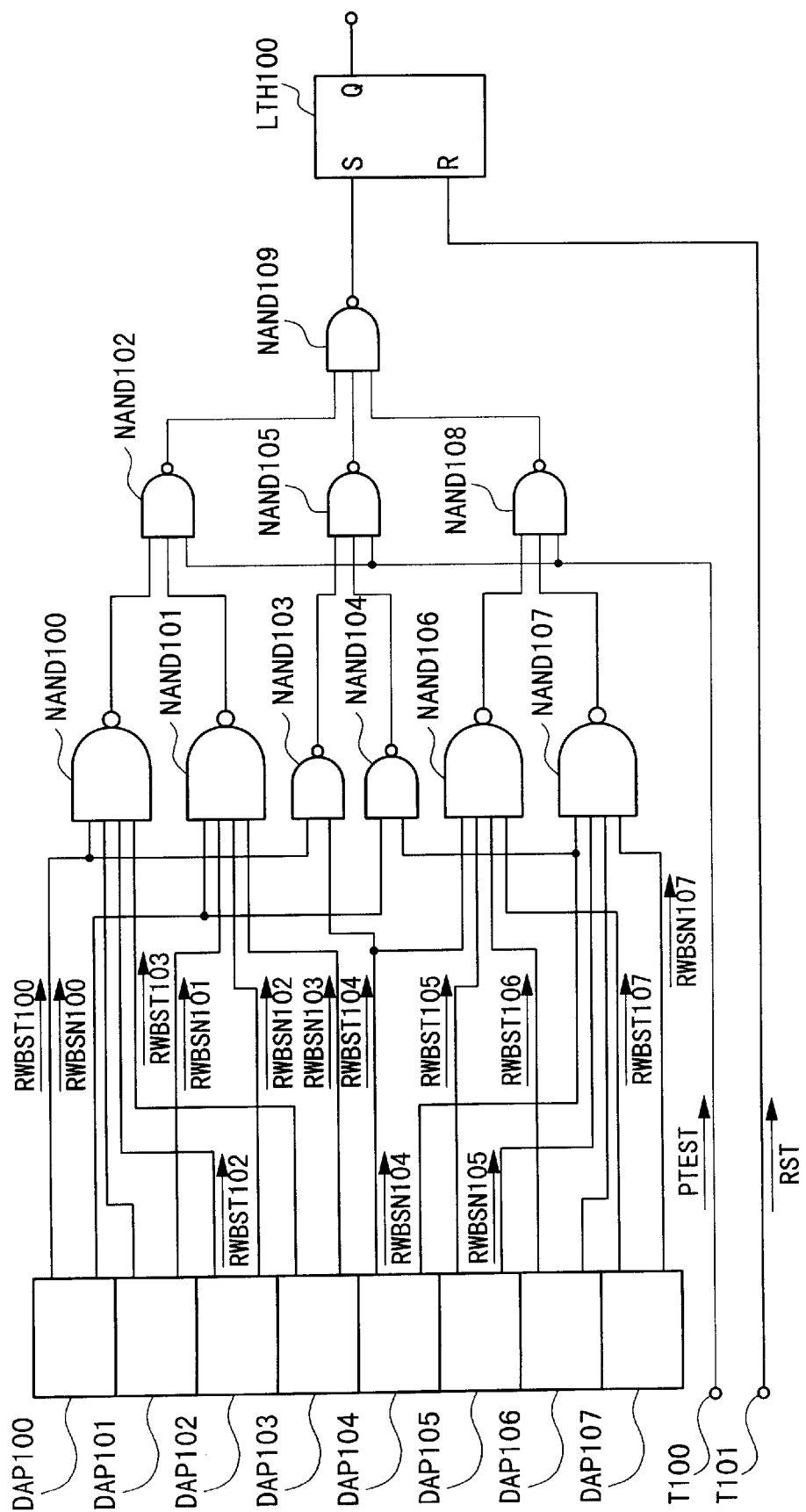
FIG. 8 is a schematic diagram showing the structure of the data compressing circuit in a conventional semiconductor memory device.
Figure 9:
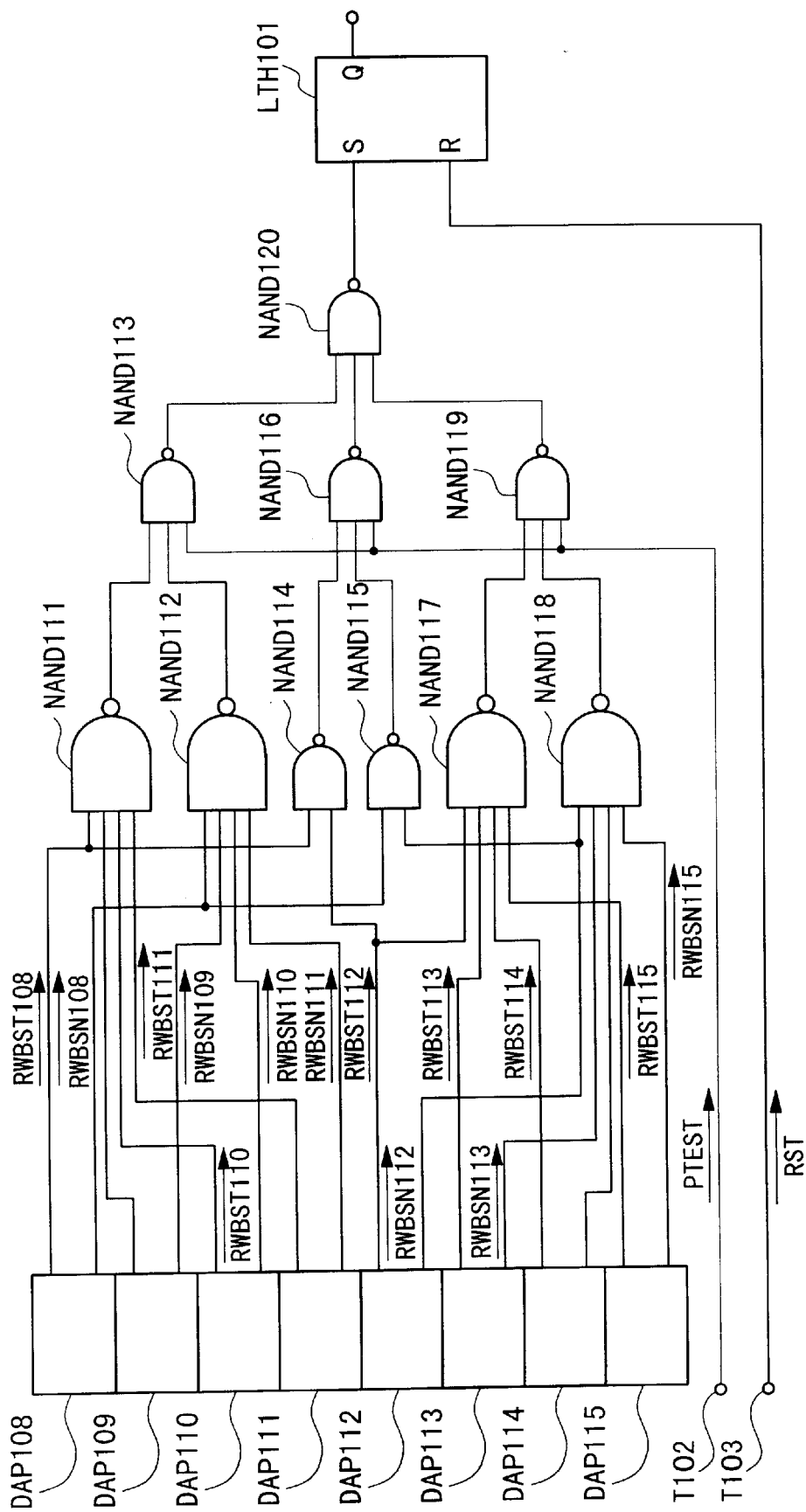
FIG. 9 is a schematic diagram showing the structure of the data compressing circuit in the conventional semiconductor memory device.
Figure 10:
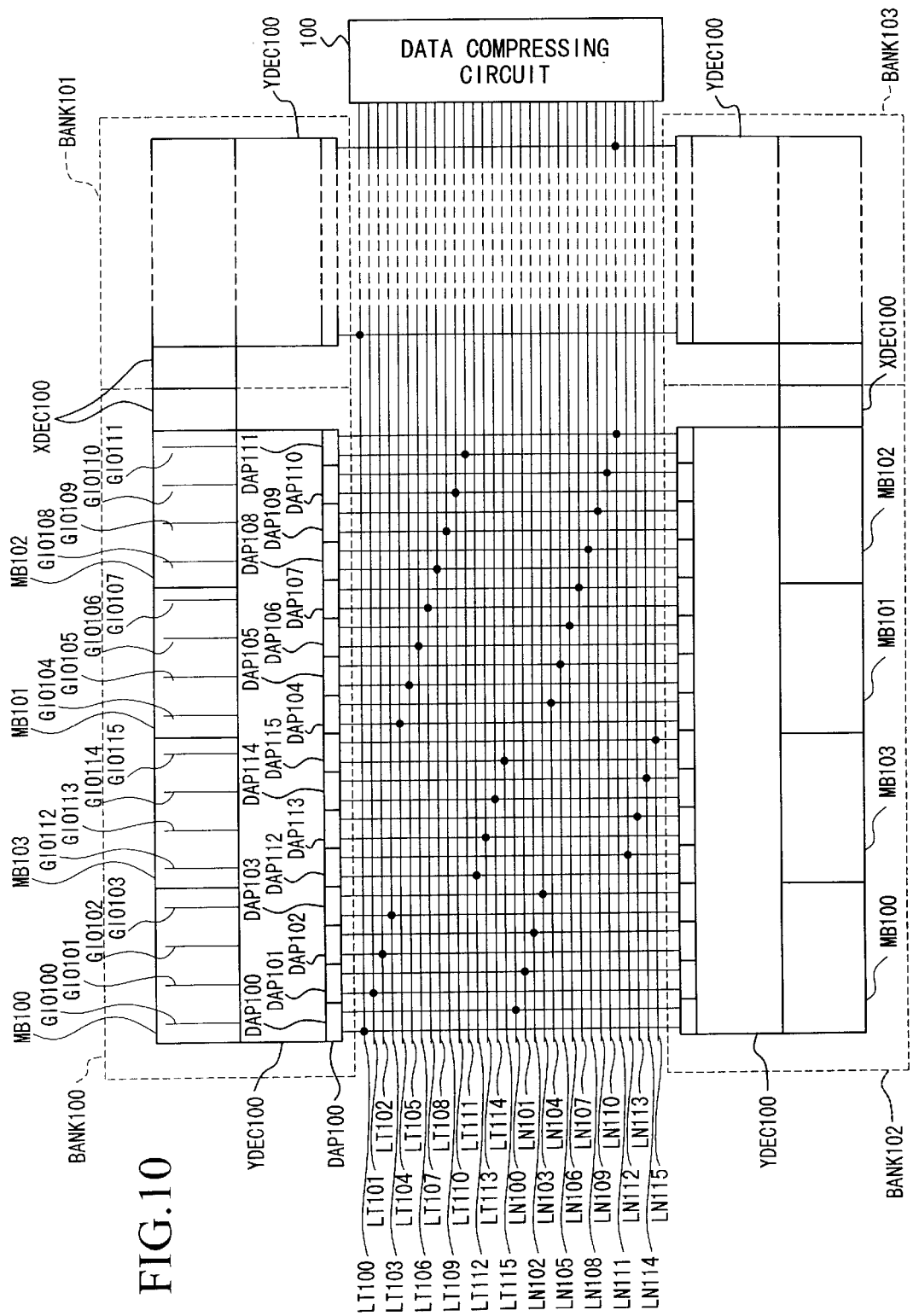
FIG. 10 is a schematic diagram showing the structure of a conventional semiconductor memory device.

For example, for a second embodiment as shown in FIG. 7, data signal RWBSN may be formed by dispersing the OR circuit.

In this case, the output of inverter INV22 in FIG. 4 is output directly to OR circuit OR50~OR circuit OR80, without providing the n channel transistor TNA in FIG. 3. By forming the final step with a NOR circuit NOR50, it is possible to form a data compressing circuit equivalent to that in FIG. 2 of the first embodiment.

In other words, if all of data DP0~DP15 which are output from amp circuit AMP in FIG. 3 are at [L] level, then data signal RWBSN output from NOR circuit NOR50 becomes [H] level. If, however, one of data DP0~DP15 is [H] level, then data signal RWBSN output from NOR circuit NOR50 becomes [L] level.

At this time, all of data DP0~data DP15 which are output from data amp DAP0~data amp DAP15 in the memory banks which are not selected are at [L] level. The other operations for data compression are equivalent to those explained above, so that an explanation here will be omitted.

In the parallel testing mode, signal TFF for the determined result discussed above is output to an external device, not shown, from a specific bit output terminal from among the 16 bit output terminals which output the data from the semiconductor memory device. As a result, the determined result for the 16 bit data read out in parallel from the 16 bit memory cell is output to an external device from the specific output terminal as one bit data.

As discussed above, in data compressing circuit 1 of the semiconductor memory device according to the second embodiment, the data signal line that is input for use in data compression becomes 16 bits (data signal)+1 bit (logical OR output of all data signals). Here, data signal RWBSN which is calculated by OR circuit OR50~OR circuit OR80 and NOR circuit NOR50 based on data DP0~data DP15 has half of the compression/determination function of the conventional data compressing circuit.

For this reason, although area for forming the dispersed OR circuit is required in this semiconductor memory device, the area needed for forming the lines from data amp DAP0~data amp DAP15 to data compressing circuit 1 can be greatly reduced as compared to the area needed to form 32 lines when employing a conventional 16 bit (data signal)+16 bit (inverted signal of the data signal).

Further, in the semiconductor memory device according to the second embodiment, the data signals employed in data compression are reduced, while at the same time, the number of logical gates at which data compressing circuit 1 also carries out compression is greatly reduced as compared to the conventional data compressing circuit. As a result, it becomes possible to decrease the area for forming the circuit.

The semiconductor memory device of the preceding second embodiment was described using the example of a semiconductor memory device having a 16 bit output. However, implementation in a semiconductor memory device having an output of 8 bits, 32 bits, 64 bits or another bit number is also possible. In addition, in the second embodiment, it is possible to communicate the data signals RWBSN employed in data compression at high speed as compared to the first embodiment. For this reason, the time required for testing can be shortened.

In addition, in the semiconductor memory device of the second embodiment, 16 bits were compressed to 1 bit. However, a design in which 16 bits are compressed to 8 bits each, and then to 2 bits is also possible. In this case, the number of lines becomes 18 bits, i.e., (8 bits+1 bit)+(8 bits+1 bit). In this way, a structure is also possible in which multiple bit outputs are separated into a plurality of compression groups, and each compressed.

In addition, in the first and second embodiments, the voltage (3.3V) of the power source is reduced, so that a lower voltage power source is achieved by reducing the internal voltage. Thus, even if the data signal is on full swing internally using one data signal line, rise characteristics on an order equivalent to that of the conventional art can be achieved and power consumption can be held to the same level. In addition, by providing one data signal line per output buffer, there is less of a tendency for noise effects due to changes in the level of the surrounding line signals, as compared to an approach in which the data signal line is amplified using a fiber which outputs the difference between the positive phase voltage and the complement voltage.

The present invention is provided with data amps provided to each output terminal for amplifying the voltage of data read out from a memory cell, outputting the result as a first output data, and outputting a second output data which is generated from this first output data; a data compressing circuit for compressing the first output data from each output terminal, and performing testing to determine whether or not this first output data read out from the memory cell is normal based on the compressed results; a plurality of first lines for outputting each first output data to the data compressing circuit from the data amps; and a second line for connecting and outputting the second output data from the data amps to the data compressing circuit using a wired OR. Thus, whereas the conventional art has required 2N lines in order to compress N bit data, in the present invention, the wired OR has the conventional compressing/determining function, so that only N lines for the bit portion and 1 line for the wired OR, i.e., (N+1) lines, are required in the present invention. Thus, the area for forming the lines can be significantly reduced as compared to the conventional 2N line example. In addition, since the wired OR has the conventional compressing/determining function, the size of the data compressing circuit can also be reduced, so that the area for forming the circuit can be decreased. Here, the reduced area is typically [data signal line width)+(data compressing circuit scale)].

Since N lines for N bits are divided into two groups and compressed in the present invention, only (N/2) lines for the bit portion and 1 line ((N/2)+1)×2 for the wired OR, i.e., (N+2) lines, are required. Thus, the area for forming the lines can be greatly reduced as compared to the conventional 2N example. In addition, since the wired OR has the conventional compressing/determining function, the size of the data compressing circuit can also be reduced, so that the area for forming the circuit can be decreased.

Accordingly, when N lines for N bits are divided into a plurality of groups and compressed, the line number becomes (number of signal line+number of wired OR lines). As a result, it is possible to reduce the number of lines as compared to the conventional 2N.

The voltage of the power source is reduced in the present invention, reducing the internal voltage and providing a low voltage power source. Thus, even if the data signal is on full swing internally using one data signal line, rise characteristics on an order. equivalent to that of the conventional art can be achieved and power consumption can be held to the same level. In addition, by providing one data signal line per output buffer, there is less of a tendency for noise effects due to changes in the level of the surrounding line signals, as compared to an approach in which the data signal line is amplified using a fiber which outputs the difference between the positive phase voltage and the complement voltage.

What is claimed:

1. A semiconductor memory device comprising:
   data amps provided to each output terminal for amplifying the voltage of data read out from a memory cell, outputting the result as a first output data, and outputting a second output data which is generated from this first output data;
   a data compressing circuit for compressing said first output data from each said output terminal, and performing testing to determine whether or not this first output data read out from the memory cell is normal based on the compressed results;
   a plurality of first lines for outputting each said first output data to said data compressing circuit from said data amps; and
   a second line for connecting and outputting said second output data from said data amps to said data compressing circuit using a wired OR.

2. A semiconductor memory device according to claim 1, wherein said data compressing circuit performs a compressing process on a plurality of first output data based on the plurality of said first output data and the wired OR output data based on the plurality of said second output data.

3. A semiconductor memory device according to claim 1, wherein equivalent data is read into all of said memory cells during testing, and said data compressing circuit determines that a correct read out was performed when all of the first output data is the same and all of the second output data is the same in the read out, and determines that an incorrect read out was performed when one of the first output data differs from the other first output data or one of the second output data differs from the other second output data in the read out.

4. A semiconductor memory device according to claim 1, further comprising transistors in which said data amps output said second output data using an open drain.

5. A semiconductor memory device according to claim 1, wherein said second line is formed by connecting the drains of said transistors in parallel.

6. A semiconductor memory device according to claim 1, wherein a transistor for precharging is connected to said second line.

7. A semiconductor memory device according to claim 1, wherein a latch circuit is provided to said second line.

8. A semiconductor memory device, comprising:
   data amps provided to each output terminal for amplifying the voltage of the data read out from a memory cell, outputting the result as a first output data, and outputting a second output data generated from this first output data;
   a data compressing circuit for compressing said first output data of each said output terminal, and performing testing to determine whether or not this first output data read out from the memory cell is normal based on the results of this compression;
   a plurality of first lines for outputting each said first output data to said data compressing circuits from these data amps; and
   a second line for connecting a plurality of OR circuits for performing an OR operation between said second output data output from said data amps and the second data output from other adjacent data amps; performing an OR operation between the result of the preceding OR operation and the second output data output from other next adjacent data amps; performing an OR operation on the second data of all the data amps sequentially; and outputting the result of this operation to said data compressing circuit as third output data.

9. A semiconductor memory device according to claim 8, wherein said data compressing circuit performs compression processing on the plurality of first output data based on the plurality of said first output data and said third output data.

* * * * *